(12) United States Patent
Kim et al.

(10) Patent No.: US 9,831,265 B2
(45) Date of Patent: Nov. 28, 2017

(54) SEMICONDUCTOR DEVICE

(71) Applicant: SAMSUNG ELECTRONICS CO., LTD., Suwon-si, Gyeonggi-do (KR)

(72) Inventors: Nambin Kim, Seoul (KR); Daewoong Kang, Seoul (KR); Dae Sin Kim, Hwaseong-si (KR); Kwang Soo Seol, Seongnam-si (KR); Homin Son, Seoul (KR); Changsub Lee, Hwaseong-si (KR); Seunghyun Lim, Seoul (KR); Sunghoi Hur, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/165,135

(22) Filed: May 26, 2016

(65) Prior Publication Data
US 2016/0351582 A1   Dec. 1, 2016

(30) Foreign Application Priority Data
May 26, 2015 (KR) ........................ 10-2015-0073117

(51) Int. Cl.
*H01L 23/48* (2006.01)
*H01L 27/11582* (2017.01)
*H01L 27/1157* (2017.01)

(52) U.S. Cl.
CPC .... *H01L 27/11582* (2013.01); *H01L 27/1157* (2013.01)

(58) Field of Classification Search
CPC ......... H01L 27/11565; H01L 21/76877; H01L 21/76816; H01L 23/53257; H01L 27/11582; H01L 23/5226; H01L 23/528; H01L 27/11568
See application file for complete search history.

(56) References Cited

U.S. PATENT DOCUMENTS

| | | | |
|---|---|---|---|
| 7,994,011 B2 * | 8/2011 | Park et al. | ........ H01L 27/11578 257/329 |
| 8,373,222 B2 | 2/2013 | Sekine et al. | |
| 8,581,321 B2 | 11/2013 | Son et al. | |
| 8,697,524 B2 | 4/2014 | You et al. | |
| 8,723,247 B2 | 5/2014 | Komori et al. | |
| 8,729,622 B2 | 5/2014 | Moon et al. | |
| 8,748,966 B2 * | 6/2014 | Whang et al. | .... H01L 27/11556 257/314 |
| 8,765,551 B2 | 7/2014 | Yang et al. | |
| 9,082,658 B2 | 7/2015 | Lee | |
| 9,093,547 B2 | 7/2015 | Lee | |
| 2007/0158736 A1 * | 7/2007 | Arai et al. | ............ H01L 27/105 257/315 |
| 2010/0308391 A1 * | 12/2010 | Kim et al. | .......... H01L 29/7926 257/314 |

(Continued)

*Primary Examiner* — Nicholas Tobergte
(74) *Attorney, Agent, or Firm* — Myers Bigel, P.A.

(57) ABSTRACT

Provided is a semiconductor device including a substrate, gate electrodes vertically stacked on the substrate, insulating patterns between the gate electrodes, an active pillar provided to penetrate the gate electrodes and the insulating patterns and electrically coupled with the substrate, and a memory pattern provided between the gate electrodes and the active pillar and between the insulating patterns and the active pillar. The gate electrodes include edge portions extending between the memory pattern and the insulating patterns.

20 Claims, 34 Drawing Sheets

(56) References Cited

U.S. PATENT DOCUMENTS

| | | | |
|---|---|---|---|
| 2014/0061750 A1* | 3/2014 | Kwon et al. | H01L 27/1052 |
| | | | 257/314 |
| 2014/0070300 A1* | 3/2014 | Jang et al. | H01L 27/11565 |
| | | | 257/324 |
| 2014/0284695 A1 | 9/2014 | Won et al. | |
| 2015/0137210 A1* | 5/2015 | Nam et al. | H01L 27/11582 |
| | | | 257/324 |
| 2015/0145014 A1* | 5/2015 | Shin et al. | H01L 27/11563 |
| | | | 257/314 |
| 2015/0145016 A1* | 5/2015 | Son et al. | H01L 27/11551 |
| | | | 257/315 |
| 2015/0221666 A1* | 8/2015 | Lee | H01L 29/66833 |
| | | | 257/66 |
| 2016/0268301 A1* | 9/2016 | Lee et al. | H01L 27/11582 |

* cited by examiner

SEMICONDUCTOR DEVICE

CROSS-REFERENCE TO RELATED APPLICATIONS

This U.S. non-provisional patent application claims priority under 35 U.S.C. §119 to Korean Patent Application No. 10-2015-0073117, filed on May 26, 2015, in the Korean Intellectual Property Office, the entire contents of which are hereby incorporated by reference.

BACKGROUND OF THE INVENTION

Example embodiments of the inventive concept relate to a semiconductor device, and in particular, to a three-dimensional semiconductor memory device with three-dimensionally arranged memory cells.

Higher integration of semiconductor devices is required to satisfy consumer demands for superior performance and inexpensive prices. In the case of semiconductor devices, since their integration is an important factor in determining product prices, increased integration is especially required. In the case of typical two-dimensional or planar semiconductor memory devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices.

To overcome such a limitation, three-dimensional (3D) semiconductor memory devices including three-dimensionally-arranged memory cells have been proposed. However, there are significant manufacturing obstacles in achieving low-cost, mass-production of 3D semiconductor memory devices, particularly in the mass-fabrication of 3D devices that maintain or exceed the operational reliability of their 2D counterparts.

SUMMARY

Example embodiments of the inventive concept provide a semiconductor device with improved reliability.

According to example embodiments of the inventive concept, a semiconductor device may include a substrate, gate electrodes vertically stacked on the substrate, insulating patterns between the gate electrodes, an active pillar provided to penetrate the gate electrodes and the insulating patterns and electrically coupled with the substrate, and a memory pattern provided between the gate electrodes and the active pillar and between the insulating patterns and the active pillar. The gate electrodes may include edge portions extending between the memory pattern and the insulating patterns.

In example embodiments, the semiconductor device may further include capping sacrificial patterns isolated between the insulating patterns and the memory pattern. The edge portions may be overlapped with the capping sacrificial patterns, when viewed in a plan view.

In example embodiments, each of the gate electrodes may include a first portion positioned between a vertically adjacent pair of the insulating patterns, and a second portion extended from the first portion and positioned between a vertically adjacent pair of the capping sacrificial patterns. The edge portions may be portions of the second portion.

In example embodiments, the second portion may include a sidewall facing the memory pattern and convexly protruding toward the memory pattern.

In example embodiments, when viewed in a sectional view, each of the edge portions may include a portion whose width decreases in a direction toward the capping sacrificial patterns.

In example embodiments, at least a portion of the edge portion may be overlapped with the capping sacrificial pattern, in a horizontal direction.

In example embodiments, the capping sacrificial patterns may be in contact with the insulating patterns.

In example embodiments, the capping sacrificial patterns may include a material different from the insulating patterns.

In example embodiments, the memory pattern may include a blocking insulating layer adjacent the gate electrodes, a tunnel insulating layer adjacent to the active pillar, and a charge storing layer between the blocking insulating layer and the tunnel insulating layer.

In example embodiments, the blocking insulating layer may be in contact with the capping sacrificial patterns.

In example embodiments, the blocking insulating layer may further include a portion interposed between the gate electrode and the capping sacrificial pattern and between the gate electrode and the insulating pattern.

In example embodiments, the semiconductor device may further include a lower semiconductor pattern interposed between the substrate and the active pillar to be in contact with the substrate.

In example embodiments, the semiconductor device may further include a lower gate electrode that is positioned at a lower level than a lowermost one of the gate electrodes. The lower semiconductor pattern may have a top surface higher than that of the lower gate electrode.

In example embodiments, a lowermost one of the capping sacrificial patterns may be in contact with a top surface of the lower semiconductor pattern.

In example embodiments, the edge portions may be provided to have a portion whose width decreases in a direction toward or away from the substrate.

In example embodiments, the active pillar may be a first active pillar, and may further comprise a second active pillar paired with the first active pillar. The substrate may have a horizontal recess under the gate electrodes, and the pair of active pillars may be connected to each other in the horizontal recess.

According to other example embodiments of the inventive concept, a semiconductor device may include a substrate, gate electrodes vertically stacked on the substrate, insulating patterns between the gate electrodes, an active pillar provided to penetrate the gate electrodes and the insulating patterns and electrically coupled with the substrate, a memory pattern interposed between the gate electrodes and the active pillar and between the insulating patterns and the active pillar, and buffer oxide patterns isolated between the gate electrodes and the memory pattern. An end portion of the gate electrode adjacent to the buffer oxide pattern may include a portion protruding toward the buffer oxide pattern.

In example embodiments, a portion of the buffer oxide pattern may be interposed between a vertically adjacent pair of the insulating patterns and other portion of the buffer oxide pattern protrudes from the portion of the buffer oxide pattern toward the memory pattern.

In example embodiments, when viewed in a sectional view, the portion of the buffer oxide pattern may have a sidewall convexly protruding toward the gate electrode, and the other portion of the buffer oxide patterns may have a sidewall convexly protruding toward the memory pattern.

In example embodiments, each of the gate electrodes may have a sidewall facing the portion of the buffer oxide pattern and having a laterally concave profile.

In example embodiments, a sidewall of the memory pattern may be rounded at a level horizontally overlapped with the buffer oxide pattern.

In example embodiments, the memory pattern may include a tunnel insulating layer adjacent the active pillar and a charge storing layer adjacent the gate electrodes.

In example embodiments, the semiconductor device may further include a blocking insulating layer interposed between the gate electrodes and the buffer oxide patterns to cover top and bottom surfaces of the gate electrodes.

In example embodiments, the blocking insulating layer may include a material whose dielectric constant is higher than that of the buffer oxide patterns.

In example embodiments, the semiconductor device may further include a lower semiconductor pattern interposed between the substrate and the active pillar to be in contact with the substrate.

In example embodiments, the semiconductor device may further include a lower gate electrode that is positioned at a lower level than a lowermost one of the gate electrodes. The lower semiconductor pattern may have a top surface higher than that of the lower gate electrode.

In example embodiments, the protruding portion may have a sharp shape.

In example embodiments, the active pillar may be a first active pillar, and may further comprise a second active pillar paired with the first active pillar. The substrate may have a horizontal recess under the gate electrodes, and the pair of active pillars may be connected to each other in the horizontal recess.

According to still other example embodiments of the inventive concept, a semiconductor device may include a stack provided on a substrate, the stack including insulating patterns stacked on the substrate and gate electrodes interposed between the insulating patterns and having a vertical hole penetrating the insulating patterns and the gate electrodes and exposing the substrate, an active pillar provided in the vertical hole, a memory pattern provided between the stack and the active pillar, and capping sacrificial patterns, each of which is isolated on a sidewall of the vertical hole and is interposed between the insulating pattern and the memory pattern. Each of the gate electrodes may include a first portion, which is interposed between a vertically adjacent pair of the insulating patterns, and a second portion, which is extended from the first portion into the vertical hole and is interposed between a vertical adjacent pair of the capping sacrificial patterns. The second portion may include portions protruding toward the capping sacrificial patterns.

In example embodiments, when viewed in a sectional view, each of the protruding portions may include a portion whose width decreases in a direction toward the capping sacrificial patterns.

In example embodiments, at least a portion of the protruding portions may be overlapped with the capping sacrificial pattern, in a horizontal direction.

In example embodiments, the capping sacrificial patterns may be in contact with the insulating patterns, respectively.

In example embodiments, the capping sacrificial patterns may include a material different from the insulating patterns.

In example embodiments, the memory pattern may include a blocking insulating layer adjacent the stack, a tunnel insulating layer adjacent the active pillar, and a charge storing layer between the blocking insulating layer and the tunnel insulating layer. The blocking insulating layer may be in contact with the capping sacrificial patterns.

In example embodiments, the blocking insulating layer may include a portion of interposed between the gate electrode and the capping sacrificial pattern and between the gate electrode and the insulating pattern.

In example embodiments, the semiconductor device may further include a lower semiconductor pattern interposed between the substrate and the active pillar to be in contact with the substrate.

In example embodiments, the protruding portions may be interposed between the memory pattern and the insulating patterns and may have sharp portions, respectively.

In example embodiments, the active pillar may be a first active pillar, and may further comprise a second active pillar paired with the first active pillar. The substrate may have a horizontal recess under the stack, and the pair of active pillars may be connected to each other in the horizontal recess.

Some embodiments of the present inventive concept include a semiconductor device that includes gate electrodes that are vertically stacked on the substrate, insulating patterns between the gate electrodes, an active pillar that penetrates the gate electrodes and the insulating patterns, a memory pattern that is between the gate electrodes and the active pillar and that is between the insulating patterns and the active pillar, and capping sacrificial patterns isolated between the insulating patterns and the memory pattern. In some embodiments, each of the gate electrodes includes a first portion positioned between a vertically adjacent pair of the insulating patterns and a second portion extended from the first portion and positioned between a vertically adjacent pair of the capping sacrificial patterns and that includes an edge portion of the gate electrode that extends between the memory pattern and the insulating patterns.

In some embodiments, the second portion comprises a sidewall that faces the memory pattern and that convexly protrudes toward the memory pattern.

Some embodiments provide that when viewed in a sectional view, each of the edge portions comprises a portion having a width that decreases in a direction toward the capping sacrificial patterns.

In some embodiments, the capping sacrificial patterns are in contact with the insulating patterns and comprise a material that is different from a material in the insulating patterns.

Some embodiments provide that the edge portion includes a portion having a width that decreases in a direction toward or away from the substrate.

In some embodiments, the active pillar is a first active pillar and the device further comprises a second active pillar that is paired with the first active pillar. The substrate has a horizontal recess under the gate electrodes, and the pair of active pillars are connected to each other in the horizontal recess.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
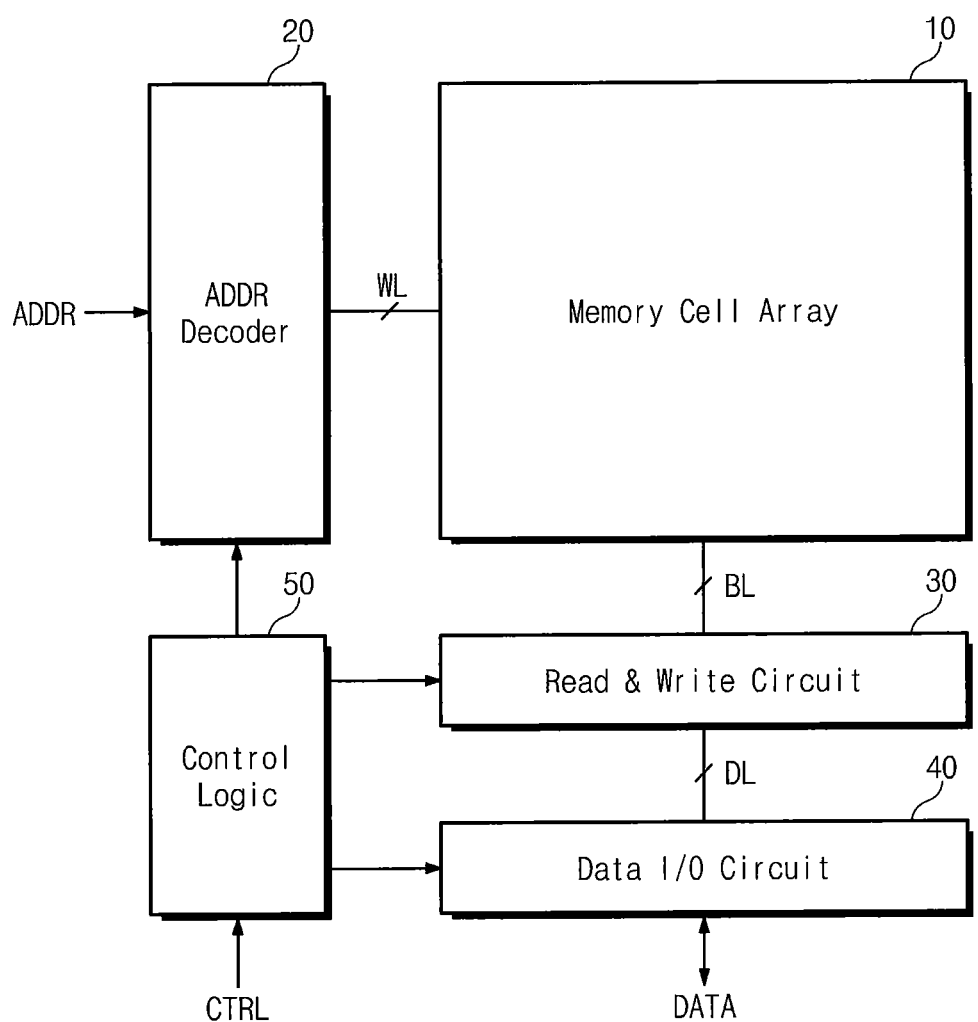
FIG. 1 is a block diagram illustrating a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating a semiconductor device according to example embodiments of the inventive concept.

Referring to FIG. 1, a semiconductor device according to embodiments of the inventive concept may include a memory cell array 10, an address decoder 20, a read/write circuit 30, a data input/output circuit 40, and a control logic 50.

The memory cell array 10 may be connected to the address decoder 20 via a plurality of word lines WL and may be connected to the read/write circuit 30 via a plurality of bit lines BL. The memory cell array 10 may include a plurality of memory cells. For example, the memory cell array 10 may be configured to store one or more bits in each cell.

The address decoder 20 may be connected to the memory cell array 10 via the word lines WL. The address decoder 20 operates according to the control of the control logic 50. The address decoder 20 may receive an address ADDR from the outside. The address decoder 20 decodes a row address among the received address ADDR to select a corresponding word line from among the word lines WL. Also, the address decoder 20 decodes a column address among the address ADDR and transfers the decoded column address to the read/write circuit 30. For example, the address decoder 20 may include elements such as a row decoder, a column decoder, and address buffer.

The read/write circuit 30 may be connected to the memory cell array 10 via the bit line BL, and be connected to the data input/output circuit 40 via the data lines DL. The read/write circuit 30 may operate according to the control of the control logic 50. The read/write circuit 30 receives the decoded column address from the address decoder 20. The read/write circuit 30 selects a bit line BL using the decoded column address. For example, the read/write circuit 30 receives data from the data input/output circuit 40 and writes the received data in the memory cell array 10. The read/write circuit 30 reads data from the memory cell array 10 and transfers the read data to the data input/output circuit 40. The read/write circuit 30 reads data from a first storage region of the memory cell array 10, and writes the read data in a second storage region of the memory cell array 10. For example, the read/write circuit 30 may perform a copy-back operation.

The read/write circuit 30 may include elements which include a page buffer (or a page register) and a column selection circuit. As another example, the read/write circuit 30 may include elements which include a sensing amplifier, a write driver and a column selection circuit.

The data input/output circuit 40 may be connected to the read/write circuit 30 via the data lines DL. The data input/output circuit 40 operates according to the control of the control logic 50. The data input/output circuit 40 exchanges data DATA with the outside. The data input/output circuit 40 transfers the data DATA to the read/write circuit 30 via the data lines DL. The data input/output circuit 40 outputs the data DATA, which is transferred from the read/write circuit 30 through the data lines DL, to the outside. For example, the data input/output circuit 40 may include an element such as a data buffer.

The control logic 50 may be connected to the address decoder 20, the read/write circuit 30 and the data input/output circuit 40. The control logic 50 controls the operation of a 3D semiconductor device. The control logic 50 may operate in response to a control signal CTRL transferred from the outside.

Figure 2:
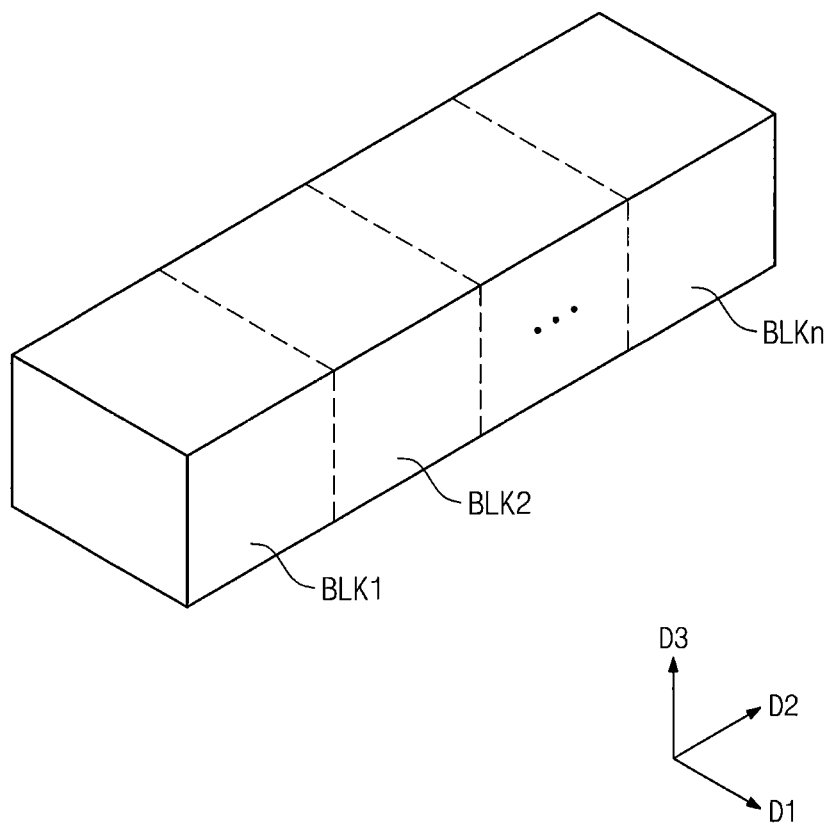
FIG. 2 is a block diagram illustrating an example of a memory cell array of FIG. 1.

FIG. 2 is a block diagram illustrating an example of a memory cell array of FIG. 1. Referring to FIG. 2, the memory cell array 10 may include a plurality of memory blocks BLK1 to BLKn. Each of the memory blocks BLK1 to BLKn may have a three-dimensional (3D) structure and/or a vertical structure. For example, the each of the memory blocks BLK1 to BLKn may include structures that are extended in first to third directions D1, D2, and D3 intersecting each other. For example, the each of the memory blocks BLK1 to BLKn includes a plurality of cell strings that are extended in the third direction D3.

Figure 3:
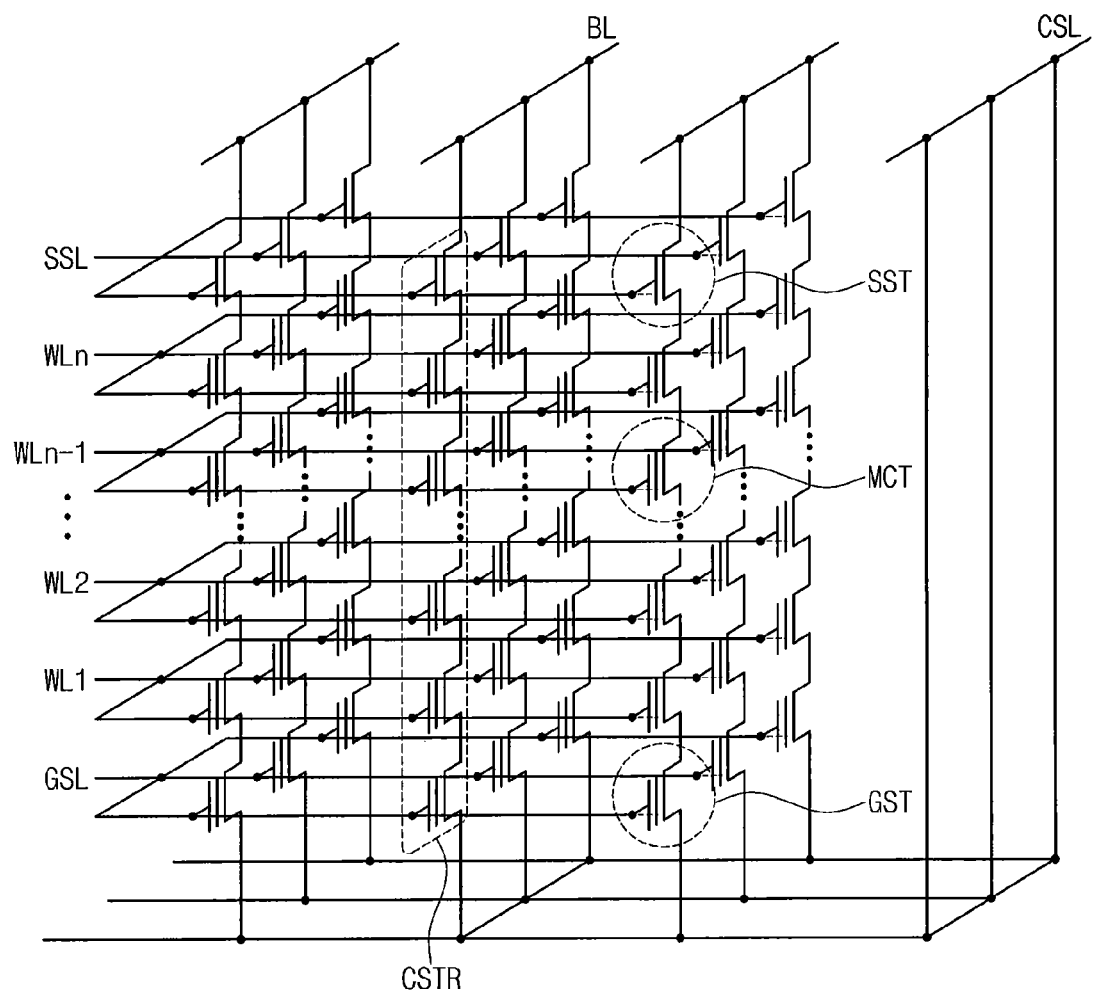
FIG. 3 is a circuit diagram schematically illustrating a cell array of a memory block of FIG. 2, according to example embodiments of the inventive concept.

FIG. 3 is a circuit diagram schematically illustrating a cell array of a memory block of FIG. 2, according to example embodiments of the inventive concept.

Referring to FIG. 3, a semiconductor device may include the common source line CSL, the bit lines BL, and the plurality of cell strings CSTR disposed between the common source line CSL and the bit lines BL. The plurality of cell strings CSTR may be connected in parallel to each of the bit lines BL.

Each of the cell strings CSTR may include the ground selection transistor GST coupled to the common source line CSL, the string selection transistor SST coupled to each of the bit lines BL, and the plurality of memory cell transistors MCT interposed between the selection transistors GST and SST. The ground selection transistor GST, the string selection transistor SST, and the memory cell transistors MCT may be connected in series. A ground selection line GSL, a plurality of word lines WL1-WLn, and a string selection line SSL may serve as gate electrodes of the ground selection transistor GST, the memory cell transistors MCT, and the string selection transistor SST, respectively.

Figure 4:
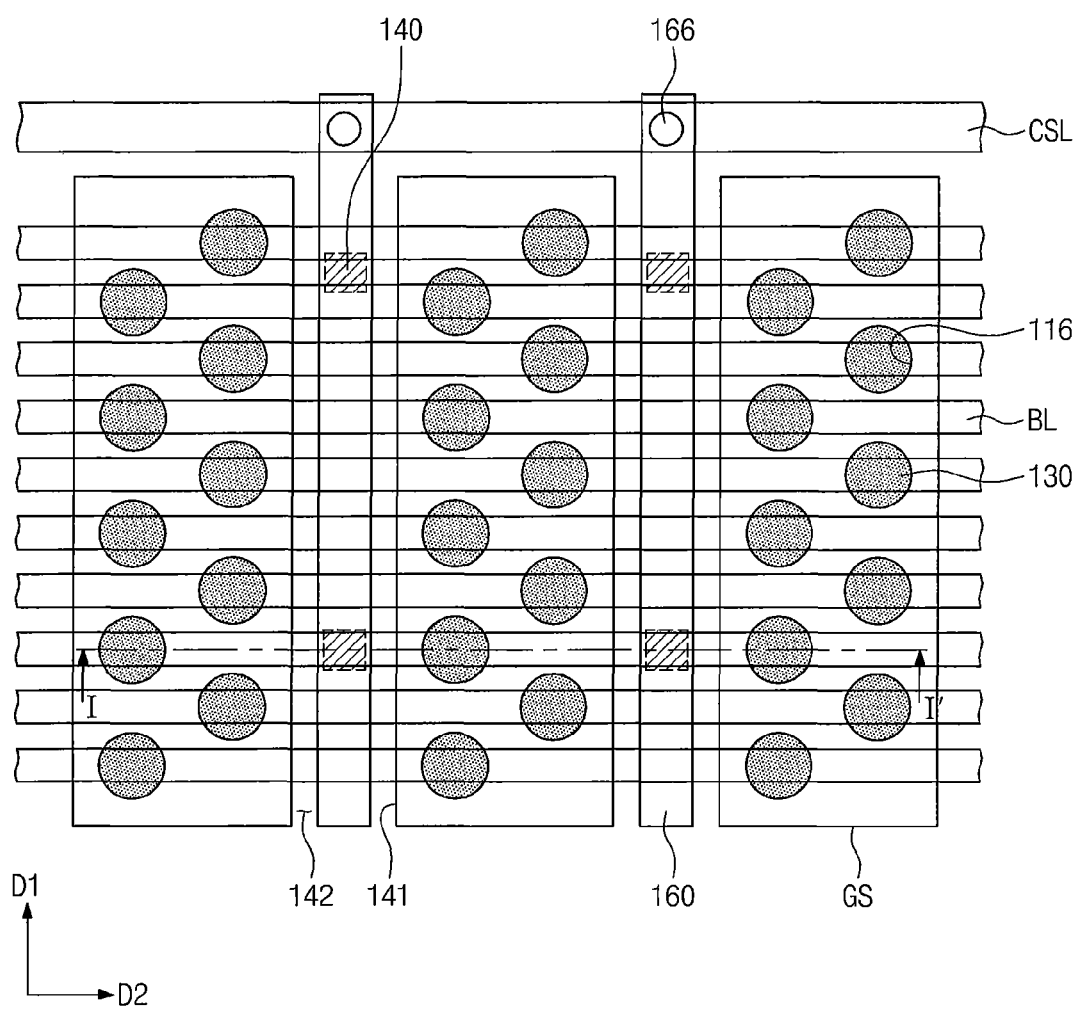
FIG. 4 is a plan view illustrating a semiconductor device according to example embodiments of the inventive concept.
Figure 5:
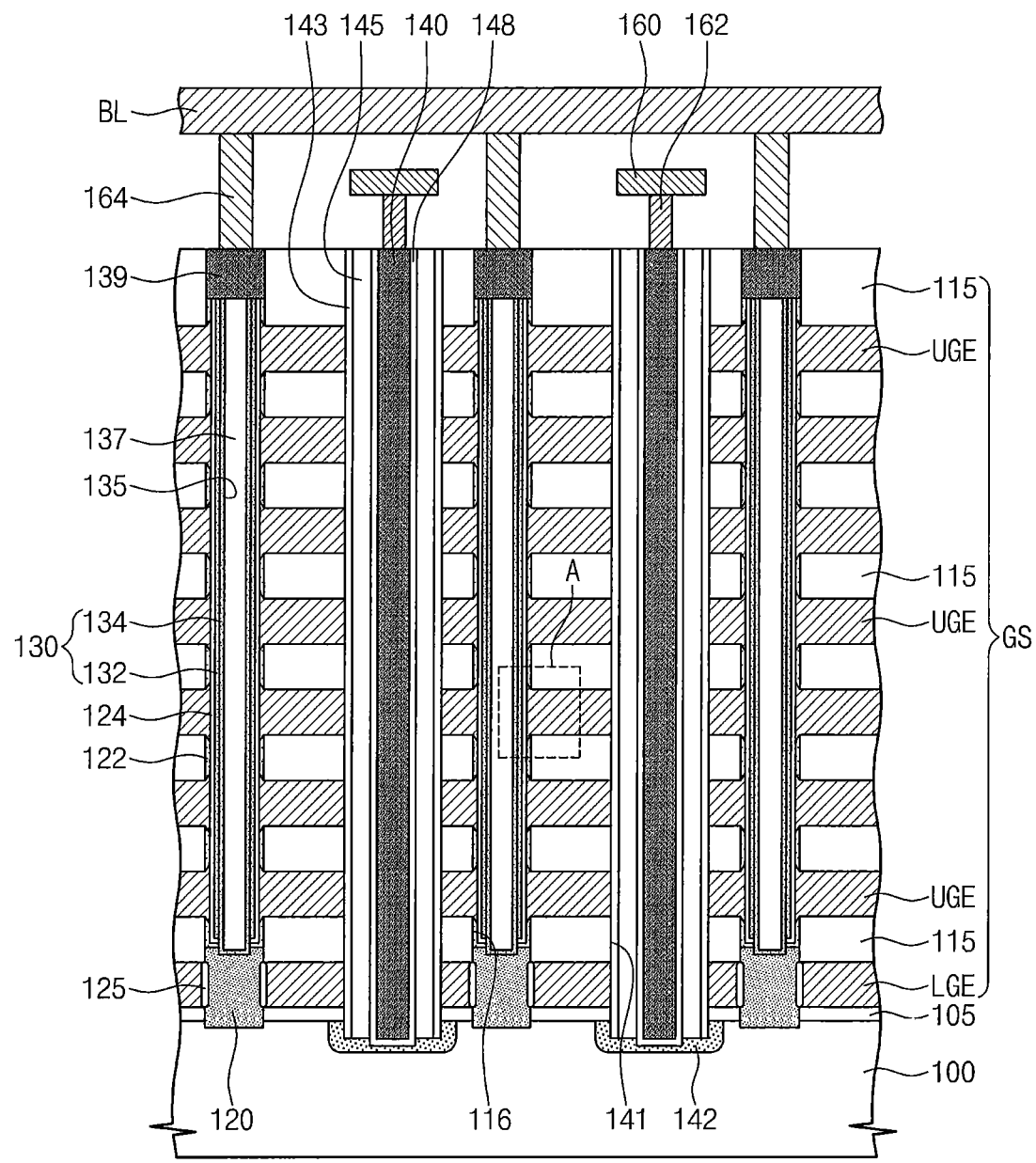
FIG. 5 is a sectional view taken along line I-I' of FIG. 4.
Figure 6A:
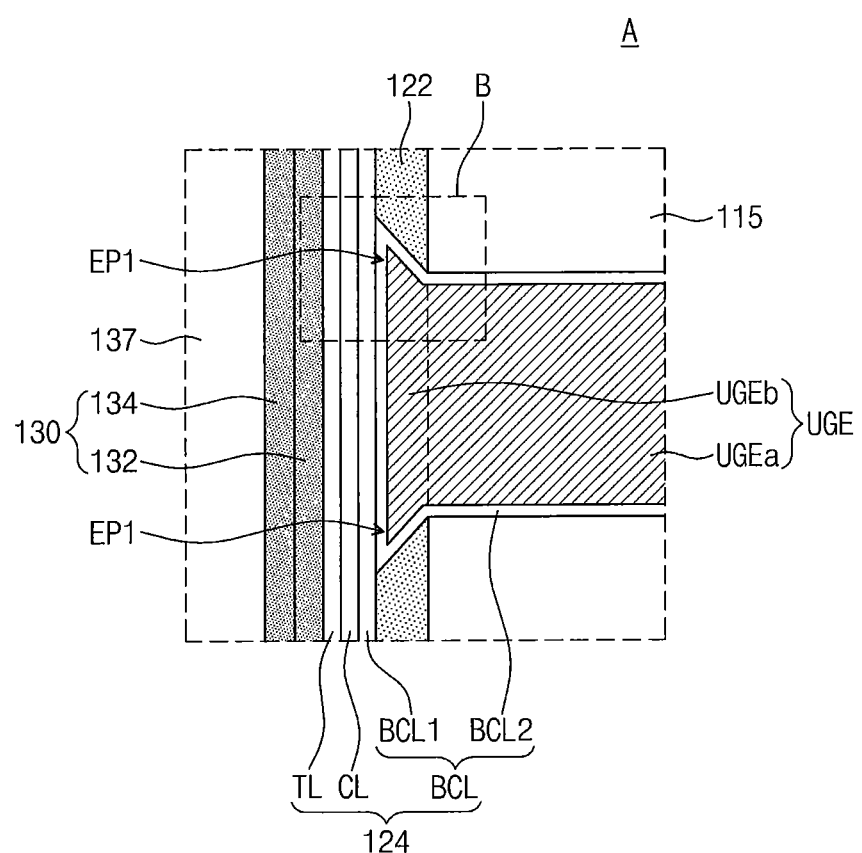
FIGS. 6A through 6C are enlarged views of a portion A of FIG. 5.
Figure 6B:
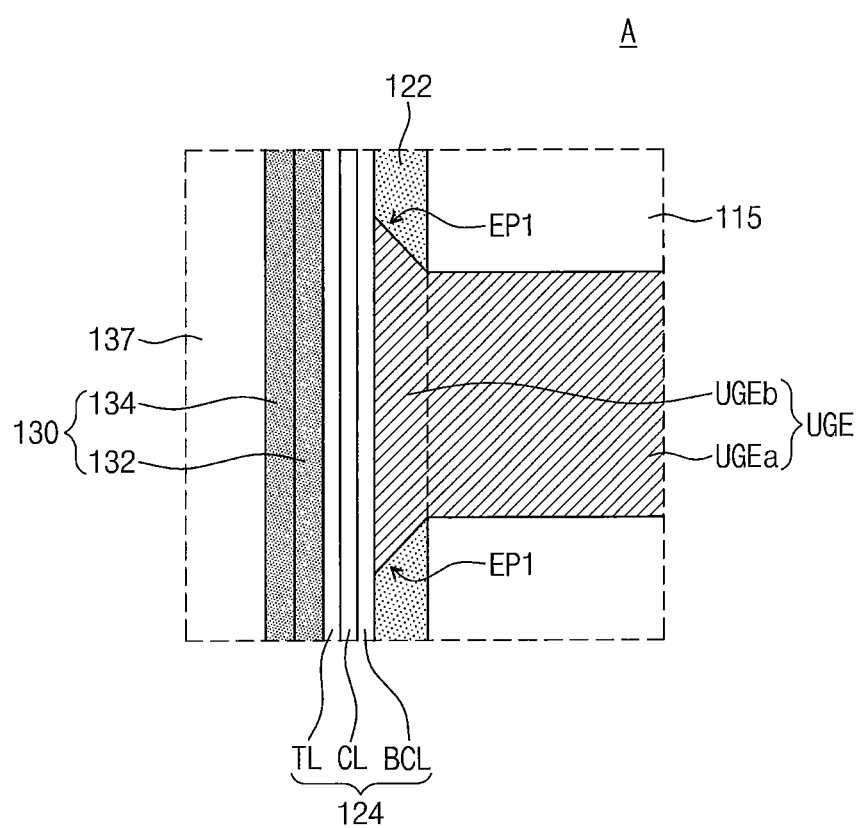
Figure 6C:
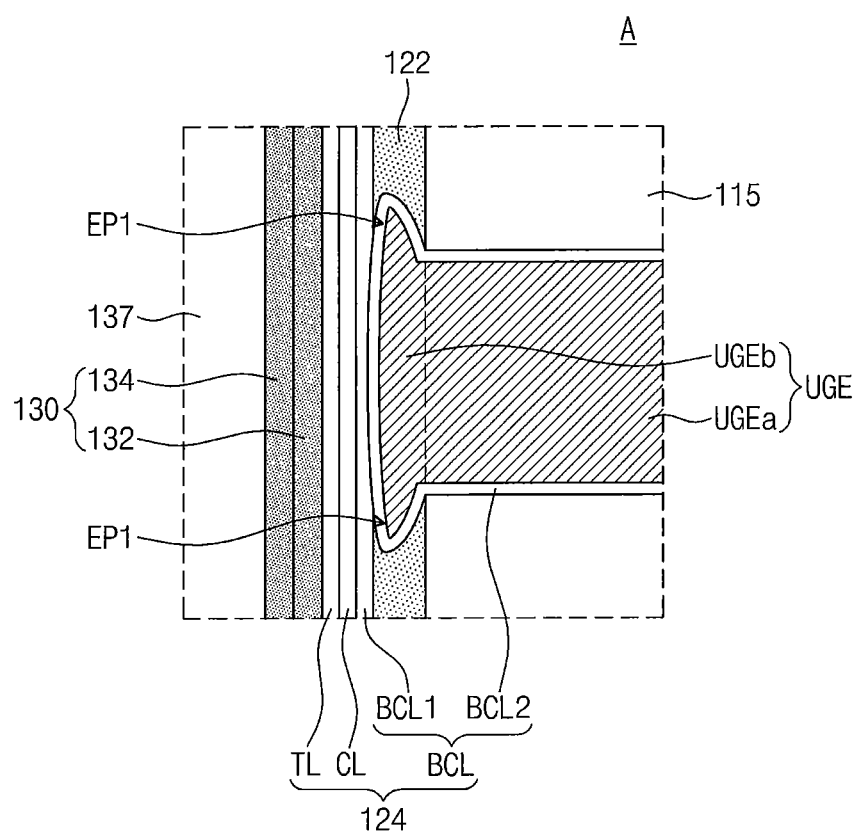
Figure 6D:
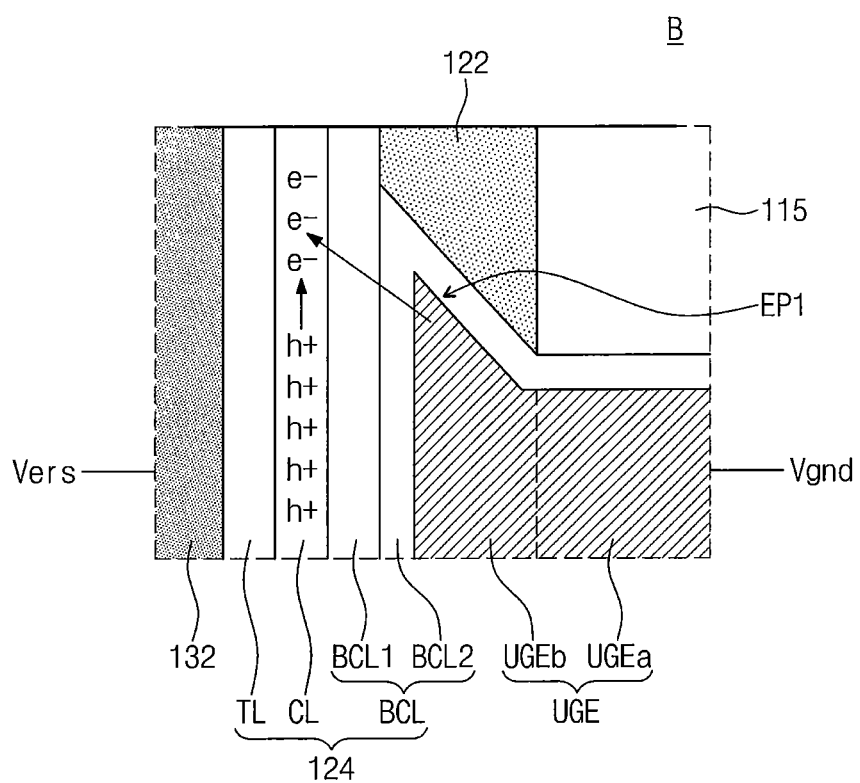
FIG. 6D is an enlarged view of a portion B of FIG. 6A to illustrate an operation of a semiconductor device according to example embodiments of the inventive concept.

FIG. 4 is a plan view illustrating a semiconductor device according to example embodiments of the inventive concept. FIG. 5 is a sectional view taken along line I-I' of FIG. 4. FIGS. 6A through 6C are enlarged views of a portion A of FIG. 5. FIG. 6D is an enlarged view of a portion B of FIG. 6A to illustrate an operation of a semiconductor device according to example embodiments of the inventive concept.

Referring to FIGS. 4 and 5, a stack GS may be provided on a substrate 100, and the stack GS may include insulating patterns 115 and gate electrodes that are alternately and repeatedly stacked on the substrate 100. The gate electrodes may include a lower gate electrode LGE on the substrate 100 and a plurality of upper gate electrodes UGE stacked on the lower gate electrode LGE.

The substrate 100 may be a semiconductor substrate having a first conductivity type (e.g., p-type). The semiconductor substrate may include at least one selected from the group consisting of a single crystalline silicon layer, a silicon on insulator (SOI) wafer, a silicon layer formed on a silicon germanium (SiGe) layer, a single crystalline silicon layer formed on an insulating layer, and/or a poly crystalline silicon layer formed on an insulating layer. The lower and upper gate electrodes LGE and UGE may include at least one of doped silicon, metals (e.g., tungsten), metal nitrides, and/or metal silicides. The insulating patterns 115 may include, for example, a silicon oxide layer.

When viewed in a plan view, the stack GS may be a line-shaped structure extending parallel to a first direction D1. In example embodiments, a plurality of stacks GS may be provided to be spaced apart from each other in a second direction D2 crossing (e.g., perpendicular to) the first direction D1. Furthermore, a lower insulating layer 105 may be provided between the substrate 100 and the stack GS. The lower insulating layer 105 may be formed of or include, for example, a silicon oxide layer. The lower insulating layer 105 may be thinner than the insulating patterns 115 provided thereon.

In example embodiments, at least one (e.g., the uppermost and lowermost ones) of the gate electrodes LGE and UGE may serve as gate electrodes of the ground and string selection transistors GST and SST described with reference to FIG. 1. For example, in a 3D NAND flash memory device, the lower gate electrode LGE may be used as the gate electrode of the ground selection transistor controlling electrical connection between a common source region 142 formed in the substrate 100 and the active pillars 130, and the uppermost one of the upper gate electrodes UGE may be used as the gate electrode of the string selection transistor controlling electrical connection between the bit line BL and the active pillars 130.

The stack GS may have a plurality of vertical holes 116 penetrating the lower and upper gate electrodes LGE and UGE and exposing the substrate 100. As shown in FIG. 4, when viewed in a plan view, the plurality of vertical holes 116 may be formed to have a zigzag arrangement in the first direction D1. However, the arrangement of the vertical holes 116 may not be limited thereto and may be variously modified.

Lower semiconductor patterns 120 may be provided at lower regions of the vertical holes 116, respectively, to be in contact with the substrate 100. The lower semiconductor patterns 120 may have top surfaces higher than that of the lower gate electrode LGE. The lower semiconductor patterns 120 may have bottom surfaces lower than the top surface of the substrate 100. In other words, each of the lower semiconductor patterns 120 may include a portion inserted into the substrate 100. The lower semiconductor patterns 120 may be formed of a semiconductor material having the same conductivity type as the substrate 100. In example embodiments, the lower semiconductor patterns 120 may be epitaxial patterns, which may be formed by an epitaxial growth process using the substrate 100 as a seed layer. The lower semiconductor patterns 120 may be formed of or include, for example, silicon and/or silicon germanium. A gate insulating layer 125 may be provided between each of the lower semiconductor patterns 120 and the lower gate electrode LGE. The gate insulating layer 125 may be formed, for example, a silicon oxide layer and/or a silicon-germanium oxide layer. The insulating pattern 115 adjacent the lower semiconductor pattern 120 may be in direct contact with a portion of a sidewall of the lower semiconductor pattern 120.

The active pillars 130 may be provided in the vertical holes 116, respectively. The active pillars 130 may be provided on the lower semiconductor patterns 120, respectively. The active pillars 130 may be electrically connected to the substrate 100 though the lower semiconductor patterns 120. The active pillars 130 may have a bottom surface positioned below the top surface of the lower semiconductor pattern 120. In other words, the active pillars 130 may be partially inserted into the lower semiconductor patterns 120, respectively. Each of the active pillars 130 may include opposite end portions, one of which is connected to the lower semiconductor patterns 120, and the other of which is connected to a corresponding one of the bit lines BL extending along the second direction D2. The active pillars 130 may serve as channel regions of MOS transistors. In other example embodiments, although not illustrated, the active pillars 130 may be directly connected to the substrate 100, without the lower semiconductor patterns 120. In other words, the lower semiconductor patterns 120 may be omitted.

In example embodiments, individual ones of the active pillars 130 may be shaped like a hollow pipe or macaroni. Here, the active pillars 130 may be provided to have a closed bottom. For example, the active pillars 130 may include a first semiconductor pattern 132 provided on a sidewall of the vertical hole 116 and a second semiconductor pattern 134 provided on a sidewall of the first semiconductor pattern 132. The first semiconductor pattern 132 may be shaped like a pipe or macaroni with open top and bottom. The first semiconductor pattern 132 may not be in contact with (i.e., spaced apart from) the lower semiconductor pattern 120. The second semiconductor pattern 134 may be shaped like a pipe or macaroni with closed bottom and open top. The second semiconductor pattern 134 may be in contact with an inner sidewall of the first semiconductor pattern 132 and the top surface of the lower semiconductor pattern 120. In example embodiments, each of the first and second semiconductor patterns 132 and 134 may include at least one of poly silicon, single crystalline silicon, and/or amorphous silicon. The first and second semiconductor patterns 132 and 134 may be in an undoped state and/or may be doped to have the same conductivity type as the substrate 100.

In some embodiments, each of the active pillars 130 may have an internal hole 135 defined by an inner surface of the second semiconductor pattern 134. The internal hole 135 may be filled with an insulating gap-filling pattern 137. The insulating gap-filling pattern 137 may be formed of or include, for example, a silicon oxide layer. Conductive pads 139 may be provided on the active pillars 130, respectively. The conductive pads 139 may be a doped semiconductor pattern or a conductive pattern.

A memory pattern 124 may be interposed between the upper gate electrodes UGE and the active pillars 130. The memory pattern 124 may include a charge storing layer of a FLASH memory device. For example, the charge storing layer may include a trap insulating layer or an insulating layer including conductive nano-dots. The memory pattern 124 may be configured in such a way that data stored therein can be changed using a Fowler-Nordheim tunneling effect, which occurs when there is a large voltage difference between the active pillars 130 and the upper gate electrodes UGE. The memory pattern 124 may include a portion interposed between the active pillars 130 and the insulating patterns 115. In other words, the memory pattern 124 may extend along a sidewall of the vertical hole 116 or in a vertical direction.

Capping sacrificial patterns 122 may be interposed between the memory pattern 124 and the insulating patterns 115. The capping sacrificial patterns 122 may be in direct contact with the insulating patterns 115 and may be spaced apart from each other, in a vertical direction, by the upper gate electrodes UGE. In other words, the capping sacrificial patterns 122 may be isolated between the insulating patterns 115 and the memory pattern 124 to have an island shape. The lowermost one of the capping sacrificial patterns 122 may be in contact with the top surface of the lower semiconductor pattern 120. The capping sacrificial patterns 122 may include a material having an etch selectivity with respect to the insulating patterns 115. The capping sacrificial patterns 122 may be formed of or may include at least one of, for example, a silicon layer, a silicon carbide layer, a silicon oxynitride layer, and/or a silicon nitride layer. In the case where the insulating patterns 115 include a silicon oxide layer, the capping sacrificial patterns 122 may be formed of or include a silicon nitride layer.

According to example embodiments of the inventive concept, each of the upper gate electrodes UGE may have an end portion with at least one sharp tip. In example embodiments, the end portion of the upper gate electrode UGE may extend in the vertical direction to be interposed between the memory pattern 124 and the insulating pattern 115. Since the upper gate electrodes UGE are provided to have the sharp tips, an electric field, which may be generated in an operation of the device, may be concentrated on the end portions of the upper gate electrodes UGE to cause a back tunneling of electrons. Hereinafter, the structure of the memory pattern 124, the shape of the end portion of the upper gate electrode UGE, and an erase operation of the device will be described in more detail with reference to FIGS. 6A through 6D.

Referring to FIG. 6A, the memory pattern 124 may include a blocking insulating layer BCL adjacent the upper gate electrode UGE, a tunnel insulating layer TL adjacent the active pillars 130, and a charge storing layer CL therebetween. The blocking insulating layer BCL may be formed of or include a high-k dielectric material (e.g., aluminum oxide or hafnium oxide). The blocking insulating layer BCL may be a multi-layered structure including a plurality of thin layers. For example, the blocking insulating layer BCL may include a first blocking insulating layer BCL1 and a second blocking insulating layer BCL2. The first blocking insulating layer BCL1 and the second blocking insulating layer BCL2 may be formed of or include, for example, aluminum oxide and/or hafnium oxide. In some embodiments, the first blocking insulating layer BCL1 may be a silicon oxide layer, and the second blocking insulating layer BCL2 may be a high-k dielectric layer (e.g., of aluminum oxide and/or hafnium oxide). One (e.g., the first blocking insulating layer BCL1) of layers constituting the blocking insulating layer BCL may be extended between the insulating patterns 115 and the active pillars 130, and the other (e.g., the second blocking insulating layer BCL2) of the layers constituting the blocking insulating layer BCL may be extended between the insulating patterns 115 and the upper gate electrodes UGE. In other words, the second blocking insulating layer BCL2 may be interposed between the upper gate electrodes UGE and the capping sacrificial patterns 122 and between the upper gate electrodes UGE and the insulating patterns 115. In other example embodiments, as shown in FIG. 6B, blocking insulating layer BCL may not be provided between the upper gate electrodes UGE and the capping sacrificial patterns 122 and between the upper gate electrodes UGE and the insulating patterns 115. In other words, like the tunnel insulating layer TL and the charge storing layer CL, the blocking insulating layer BCL may be extended between the insulating patterns 115 and the active pillars 130. In this case, edge portions EP1 of the upper gate electrodes UGE may be in direct contact with the capping sacrificial patterns 122, as will be described below.

The charge storing layer CL may be a charge trap layer or an insulating layer with conductive nano particles. In more detail, the charge storing layer CL may include at least one of, for example, a silicon nitride layer, a silicon oxynitride layer, a silicon-rich nitride layer, or a nano-crystalline silicon layer. The charge storing layer CL may be extended between the insulating patterns 115 and the active pillars 130. In other words, the charge storing layer CL may extend along the sidewall of the vertical hole 116 or in the vertical direction.

The tunnel insulating layer TL may be formed of at least one of insulating layers, whose band gaps are greater than that of the charge storing layer CL. As an example, the tunnel insulating layer TL may be a silicon oxide layer. The tunnel insulating layer TL may be provided on a sidewall of the charge storing layer CL and may extend in the vertical direction.

As shown in FIG. 6A, each of the upper gate electrodes UGE may include a first portion UGEa, which is interposed between the insulating patterns 115 adjacent to each other in the vertical direction, and a second portion UGEb, which is extended from the first portion UGEa into the vertical hole 116 and is interposed between the capping sacrificial patterns 122 adjacent to each other in the vertical direction. In other words, when viewed in a plan view, the second portion UGEb may be overlapped with the capping sacrificial patterns 122. The second portion UGEb may include edge portions EP1 interposed between the memory pattern 124 and the insulating patterns 115. When viewed in a sectional view, the edge portion EP1 may have a shape protruding toward the capping sacrificial pattern 122. According to example embodiments of the inventive concept, the edge portion EP1 may include a sharp portion (for example, shaped like a tip). In other words, when viewed in a sectional view, the edge portions EP1 may include a portion whose width or thickness decreases in a direction toward the capping sacrificial patterns 122. Although, in FIG. 6A, the edge portion EP1 is illustrated to have a right triangular section, but example embodiments of the inventive concept are not limited to the examples. As another example, the edge portions EP1 may have a trapezoidal section. As still other example, the edge portions EP1 may have a wedge-shaped section tapering toward the capping sacrificial patterns 122. In example embodiments, at least a portion of the edge portion EP1 of the second portion UGEb may be overlapped with the capping sacrificial patterns 122 in a horizontal direction.

Although, in FIG. 6A, a sidewall of the second portion UGEb facing the memory pattern 124 is illustrated to be perpendicular to the top surface of the substrate 100, but example embodiments of the inventive concept are not limited thereto. For example, as shown in FIG. 6C, the sidewall of the second portion UGEb facing the memory pattern 124 may have a convex shape toward the memory pattern 124. In other words, the edge portion EP1 of the second portion UGEb may be provided to have a convex slope.

The sharp shape of the edge portion EP1 may make it possible to concentrate an electric field on the edge portion EP1, when an erase operation is performed on the semiconductor device. Accordingly, it is easy to cause a back tunneling of electrons, during the erase operation on the semiconductor device. In detail, the erase operation on the semiconductor device may be performed with erase and ground voltages Vers and Vgnd, which are respectively applied to the active pillar 130 (or the substrate 100) and the upper gate electrode UGE, and in this case, an electric field may be concentrated on the edge portion EP1 of the second portion UGEb, as shown in FIG. 6D. Accordingly, the back tunneling of electrons may occur through the edge portion EP1 of the second portion UGEb; that is, electrons (e−) may be injected into the charge storing layer CL adjacent the edge portions EP1. The injected electrons (e−) may prevent or suppress holes (h+) trapped in the charge storing layer CL from being vertically spread, during the erase operation of the semiconductor device. This makes it possible to suppress electric charges (i.e., holes) stored in the charge storing layer from being lost and thereby to improve a charge retention property of the semiconductor device. As a result, the semiconductor device can have an improved reliability property.

Referring back to FIGS. 4 and 5, an isolation trench 141 may be provided between adjacent pairs of the stacks GS. The common source region 142 may be provided in a portion of the substrate 100 exposed by the isolation trench 141. The common source region 142 may extend parallel to the first direction D1, in the substrate 100. The common source region 142 may have a second conductivity type (e.g., n-type) different from the first conductivity type. A device isolation pattern 145 may be provided on the common source regions 142 to fill the isolation trench 141. The device isolation pattern 145 may include a silicon oxide layer.

Common contacting layers (not shown) may be provided between the device isolation pattern 145 and the common source regions 142. The common contacting layers (not shown) may be formed of a metal-semiconductor compound layer. For example, the common contacting layers may be formed of a metal silicide layer. An insulating spacer 143 may be provided on the sidewalls of the stacks GS. In other words, the insulating spacer 143 may be provided between the sidewalls of the stacks GS and the device isolation pattern 145. The insulating spacer 143 may include at least one of a silicon oxide layer, a silicon oxynitride layer, a silicon nitride layer, and/or an aluminum oxide layer.

Strapping plugs 140 may be provided to penetrate the device isolation pattern 145 and be electrically connected to the common source regions 142. The strapping plugs 140 may be arranged along the first direction D1. A barrier layer 148 may be provided between the strapping plugs 140 and the device isolation pattern 145. The strapping plugs 140 may include a metallic layer (e.g., of tungsten, copper, or aluminum). The barrier layer 148 may include a conductive metal nitride layer (e.g., of titanium nitride or tantalum nitride). The common contacting layers (not shown) may be provided between the strapping plugs 140 and the common source regions 142.

A strapping line 160 may be provided on the device isolation pattern 145 and may extend parallel to the first direction D1. The strapping line 160 may be electrically connected to the strapping plugs 140 through the first contacts 162. The strapping line 160 and the first contacts 162 may include at least one selected from the group consisting of metals (e.g., tungsten, copper, or aluminum), conductive metal nitrides (e.g., titanium nitride or tantalum nitride), and/or transition metals (e.g., titanium or tantalum).

The bit lines BL may be provided on the strapping line 160 and may extend parallel to the second direction D2. The bit lines BL may be electrically connected to the active pillars 130 through second contacts 164. The bit lines BL and the second contacts 164 may include at least one selected from the group consisting of metals (e.g., tungsten, copper, or aluminum), conductive metal nitrides (e.g., titanium nitride or tantalum nitride), and/or transition metals (e.g., titanium or tantalum).

The common source line CSL may be provided on the strapping line 160 and may extend parallel to the second direction D2. The common source line CSL may be electrically connected to the strapping line 160 through third contacts 166. The common source line CSL and the third contacts 166 may include at least one selected from the group consisting of metals (e.g., tungsten, copper, or aluminum), conductive metal nitrides (e.g., titanium nitride or tantalum nitride), and/or transition metals (e.g., titanium or tantalum).

Hereinafter, a method of fabricating a semiconductor device according to example embodiments of the inventive concept will be described. FIGS. 7, 8, 9A, 10, 11, 12, 13A, and 14 are sectional views taken along line I-I' of FIG. 4 to illustrate methods of fabricating a semiconductor device according to some example embodiments of the inventive concept. FIGS. 9B and 13B are enlarged views of portions A of FIGS. 9A and 13A, respectively.

Figure 7:
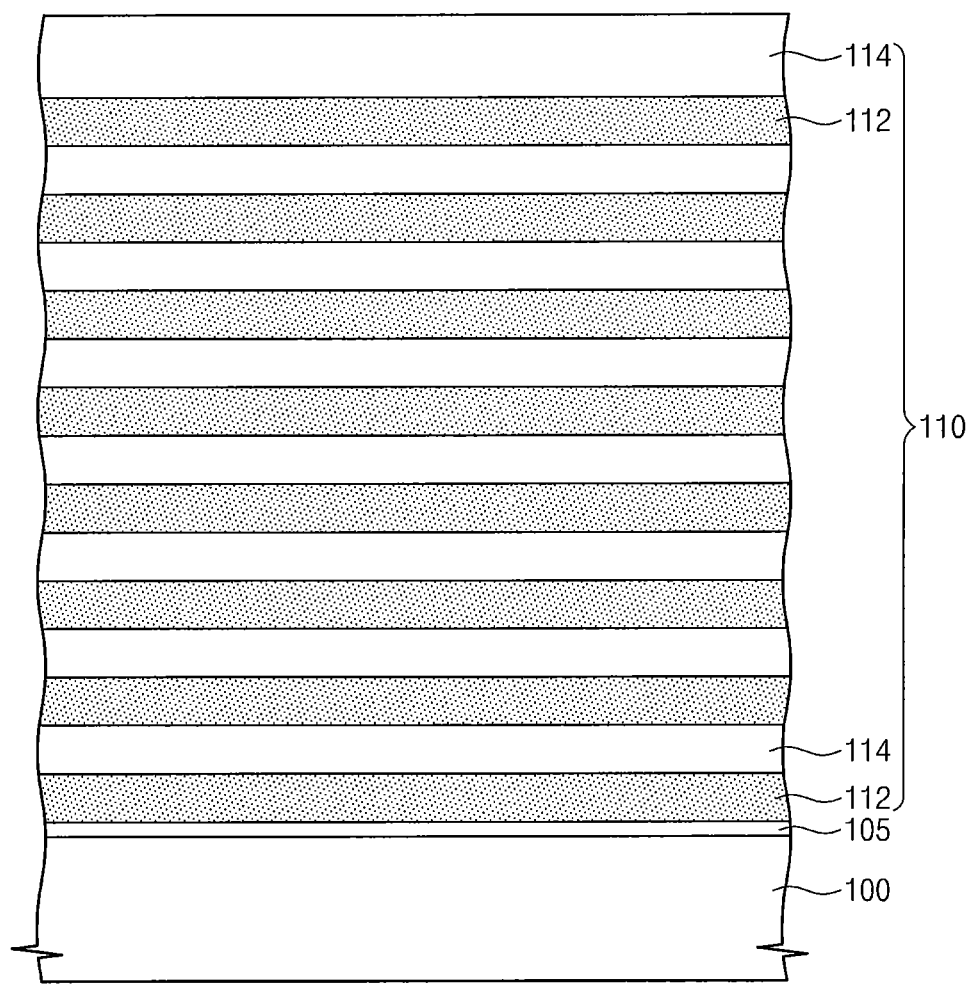
FIG. 7 is a sectional view taken along line I-I' of FIG. 4 to illustrate an operation in methods of fabricating a semiconductor device according to example embodiments of the inventive concept.

Referring to FIG. 7, sacrificial layers 112 and insulating layers 114 may be alternately stacked on the substrate 100 to form a layered structure 110. The substrate 100 may be a semiconductor substrate having a first conductivity type (e.g., p-type). The semiconductor substrate may include at least one selected from the group consisting of a single crystalline silicon layer, a silicon on insulator (SOI) wafer, a silicon layer formed on a silicon germanium (SiGe) layer, a single crystalline silicon layer formed on an insulating layer, and/or a poly crystalline silicon layer formed on an insulating layer.

The sacrificial layers 112 may be formed of or include a material, which can be etched with a high etch selectivity with respect to the insulating layers 114. In example embodiments, materials for the sacrificial layers 112 and the insulating layers 114 may be selected in such a way that they are etched to have a high etch selectivity in a wet etching process using chemical solution and a low etch selectivity in a dry etching process using etching gas. The sacrificial layers 112 may be formed of or include at least one of, for example, a silicon layer, a silicon carbide layer, a silicon oxynitride layer, and/or a silicon nitride layer. The insulating layers 114 may be at least one of a silicon layer, a silicon oxide layer, a silicon carbide layer, a silicon oxynitride layer, and/or a silicon nitride layer, but it may be formed of a material selected to be different from the sacrificial layers 112. For example, the sacrificial layers 112 may be formed of a silicon nitride layer, and the insulating layers 114 may be formed of a silicon oxide layer. In other example embodiments, the sacrificial layers 112 may be formed of a silicon layer, and the insulating layers 114 may be formed of a silicon oxide layer.

In example embodiments, the sacrificial layers 112 may be formed to have substantially the same thickness. However, in other example embodiments, the uppermost and lowermost ones of the sacrificial layers 112 may be formed to be thicker than the others. The insulating layers 114 may be formed to have substantially the same thickness, but in other example embodiments, at least one (e.g., the uppermost one) of the insulating layers 114 may have a different thickness than the others. The sacrificial layers 112 and the insulating layers 114 may be formed by for example, a chemical vapor deposition (CVD) process. Furthermore, the lower insulating layer 105 may be formed between the substrate 100 and the layered structure 110. For example, the lower insulating layer 105 may be or may include a silicon oxide layer, which may be formed by a thermal oxidation process. In some embodiments, the lower insulating layer 105 may be or may include a silicon oxide layer, which may be formed by a deposition process. The lower insulating layer 105 may be formed to be thinner than the sacrificial layers 112 and the insulating layers 114.

Figure 8:
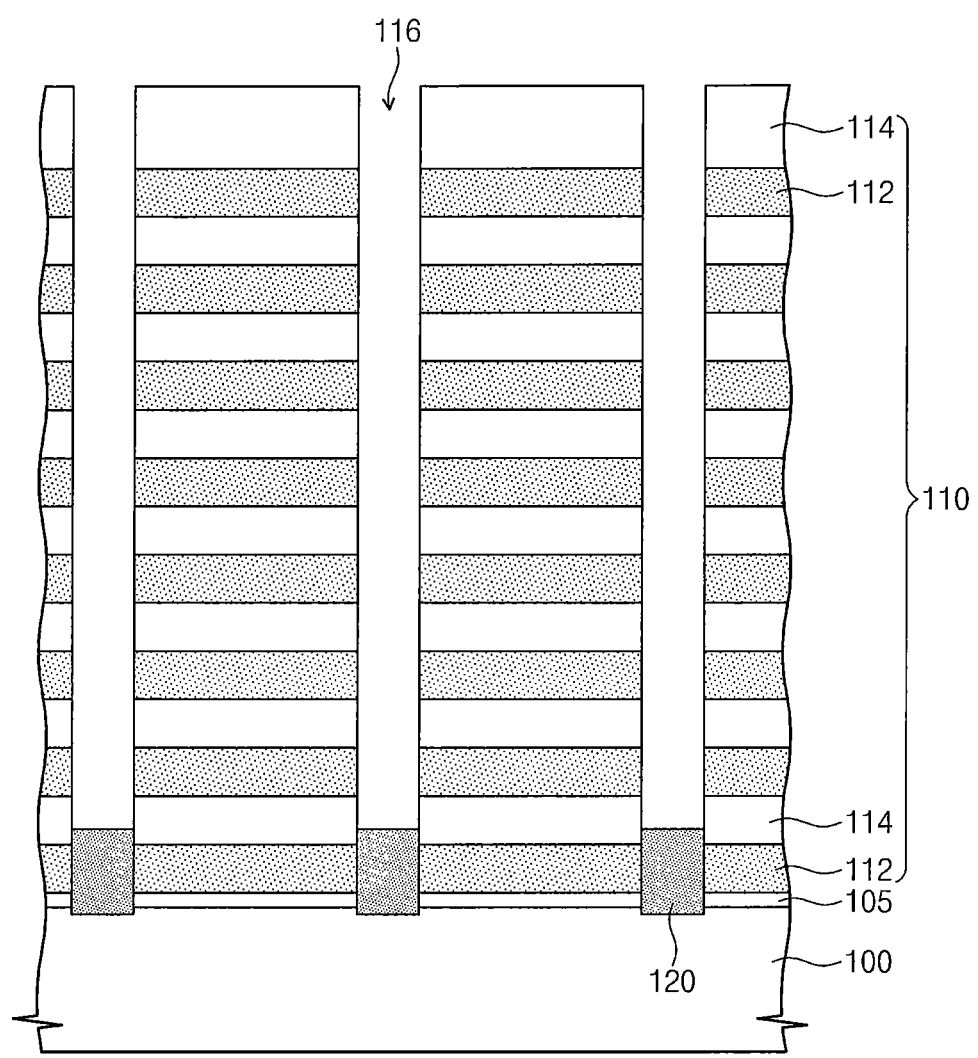
FIG. 8 is a sectional view taken along line I-I' of FIG. 4 to illustrate an operation in methods of fabricating a semiconductor device according to example embodiments of the inventive concept.

Referring to FIG. 8, the vertical holes 116 may be formed to penetrate the layered structure 110 and expose the substrate 100.

In example embodiments, the formation of the vertical holes 116 may include forming a mask pattern (not shown) on the layered structure 110 and performing an anisotropic etching process using the mask pattern (not shown) as an etch mask. The anisotropic etching process may be performed in an over-etch manner (for example, to partially recess the top surface of the substrate 100), and thus, portions of the substrate 100 below the vertical holes 116 may be recessed to a specific depth. The vertical holes 116 may be two-dimensionally formed on the substrate 100, when viewed in a plan view. For example, as shown in FIG. 4, the vertical holes 116 may be formed to form a zigzag arrangement in the first direction D1. But example embodiments of the inventive concept may not be limited thereto.

Thereafter, the lower semiconductor patterns 120 may be formed at lower regions of the vertical holes 116, respectively. The lower semiconductor patterns 120 may be formed by a selective epitaxial growth (SEG) process, in which the substrate 100 exposed by the vertical holes 116 is used as a seed layer. Each of the lower semiconductor patterns 120 may be formed to fill the recessed region of the substrate 100 and protrude from the top surface of the substrate 100. Each of the lower semiconductor patterns 120 may cover a sidewall of at least one of the sacrificial layers 112. For example, the lower semiconductor patterns 120 may be formed in such a way that their top surfaces are positioned between the lowermost and next-lowermost layers of the sacrificial layers 112. Accordingly, the lower semiconductor patterns 120 may be in direct contact with sidewalls of two lowermost layers of the layered structure 110 (i.e., the lowermost sacrificial layer 112 and the lowermost insulating layer 114). The lower semiconductor patterns 120 may be formed of or include silicon or silicon germanium.

Figure 9A:
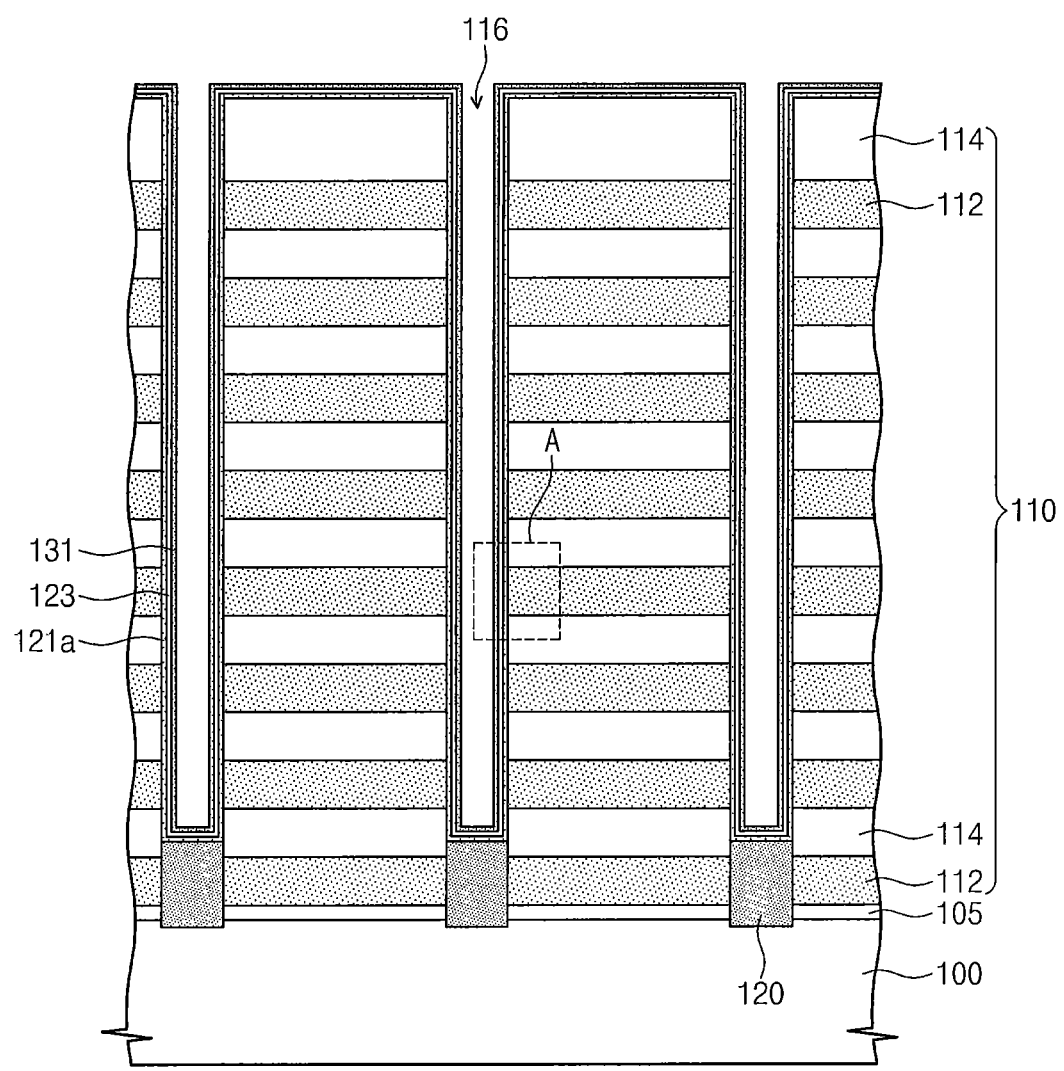
FIG. 9A is a sectional view taken along line I-I' of FIG. 4 to illustrate an operation in methods of fabricating a semiconductor device according to example embodiments of the inventive concept.
Figure 9B:
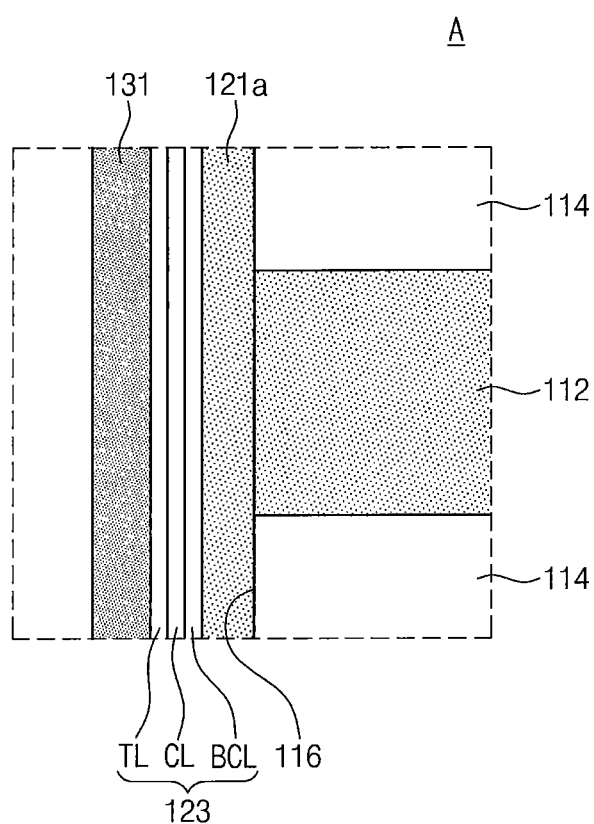
FIG. 9B is an enlarged view of portion A of FIG. 9A.

Referring to FIGS. 9A and 9B, a capping sacrificial layer 121*a*, a memory layer 123, and a first semiconductor layer 131 may be sequentially formed in the vertical holes 116. The capping sacrificial layer 121*a*, the memory layer 123, and the first semiconductor layer 131 may be formed not to fill the whole region of the vertical hole 116. In some embodiments, the memory layer 123 may include the blocking insulating layer BCL, the charge storing layer CL, and the tunnel insulating layer TL.

In detail, the capping sacrificial layer 121*a* may be formed on the sidewalls of the vertical holes 116. The capping sacrificial layer 121*a* may be in direct contact with the sidewalls of the sacrificial layers 112 and the insulating layers 114 that are exposed by the vertical holes 116. The capping sacrificial layer 121*a* may be formed of substantially the same material as the sacrificial layers 112. In other words, the capping sacrificial layer 121*a* may be at least one of a silicon layer, a silicon carbide layer, a silicon oxynitride layer, and/or a silicon nitride layer, but it may be formed of a material selected to be different from the insulating layers 114. The capping sacrificial layer 121*a* may be formed by a chemical vapor deposition or an atomic layer deposition process. The capping sacrificial layer 121*a* may be formed to cover the top surfaces of the lower semiconductor patterns 120 and the top surface of the layered structure 110.

The blocking insulating layer BCL may be formed on the capping sacrificial layer 121*a*. The blocking insulating layer BCL may be a multi-layered structure including a plurality of thin layers. For example, the first blocking insulating layer BCL1 may include an aluminum oxide layer and a silicon oxide layer, and a stacking order or position of the aluminum oxide layer and the silicon oxide layer may be variously changed. The blocking insulating layer BCL may be formed by a chemical vapor deposition or an atomic layer deposition process.

The charge storing layer CL may be formed on the blocking insulating layer BCL. The charge storing layer CL may be a charge trap layer or an insulating layer with conductive nano particles. Here, the charge trap layer may include, for example, a silicon nitride layer. The charge storing layer CL may be formed by a chemical vapor deposition or an atomic layer deposition process.

The tunnel insulating layer TL may be formed on the charge storing layer CL. The tunnel insulating layer TL may be formed of at least one of insulating layers, whose band gaps are greater than that of the charge storing layer CL. As an example, the tunnel insulating layer TL may be a silicon oxide layer. The tunnel insulating layer TL may be formed by a chemical vapor deposition or an atomic layer deposition process.

The first semiconductor layer 131 may be formed on the tunnel insulating layer TL. The first semiconductor layer 131 may be formed of a semiconductor material (e.g., poly silicon, single crystalline silicon, and/or amorphous silicon), which may be formed using an atomic layer deposition (ALD) process or a chemical vapor deposition (CVD) process. The first semiconductor layer 131 may be formed to cover the memory layer 123, and thus, it is possible to protect the memory layer 123 from an etch damage in a subsequent etching process.

Figure 10:
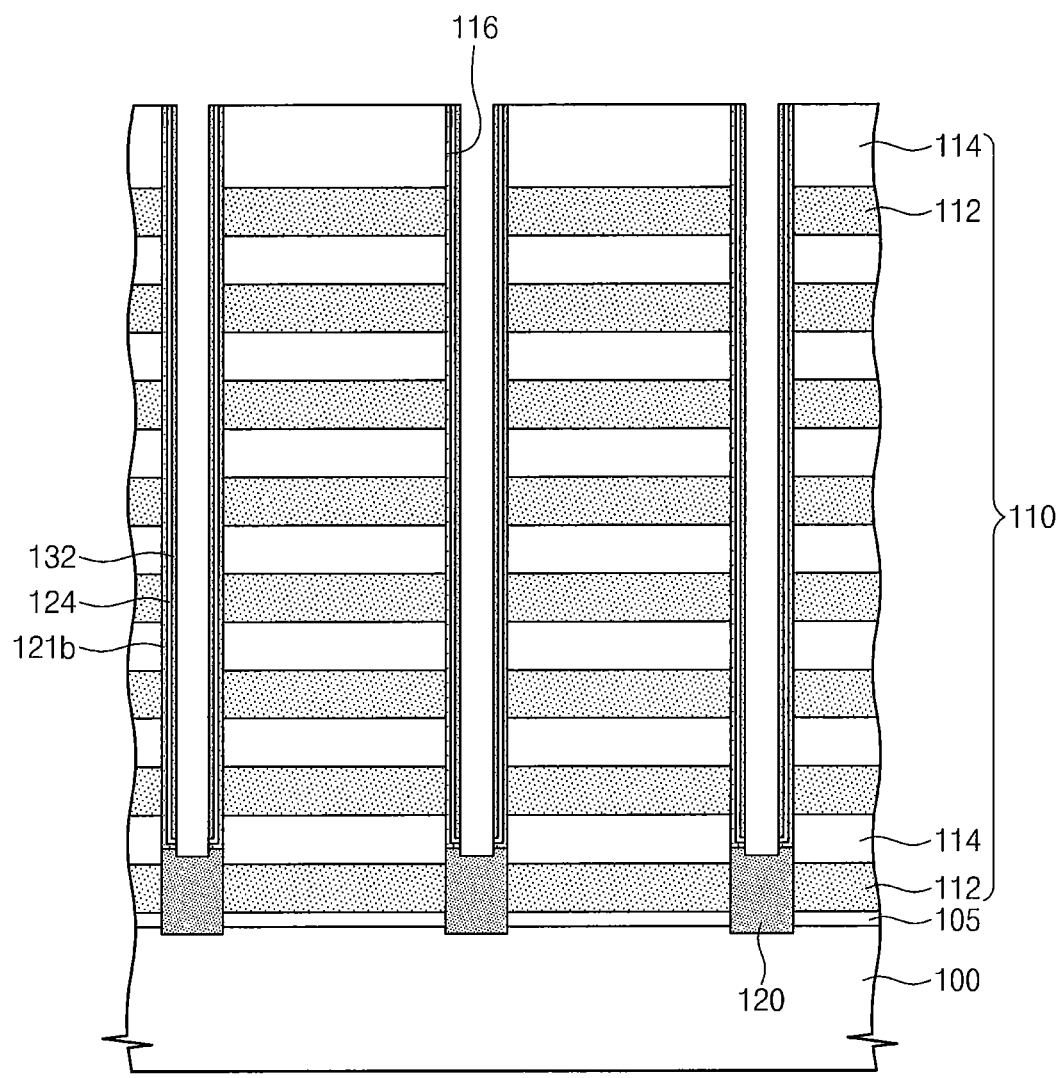
FIG. 10 is a sectional view taken along line I-I' of FIG. 4 to illustrate an operation in methods of fabricating a semiconductor device according to example embodiments of the inventive concept.

Referring to FIG. 10, the capping sacrificial layer 121*a*, the first semiconductor layer 131, and the memory layer 123 on bottom regions of the vertical holes 116 may be etched to expose the top surfaces of the lower semiconductor patterns 120. Accordingly, a preliminary capping sacrificial pattern 121*b*, the memory pattern 124, and the first semiconductor pattern 132 may be formed on an inner sidewall of each of the vertical holes 116. In other words, the preliminary capping sacrificial pattern 121*b*, the memory pattern 124, and the first semiconductor pattern 132 may be shaped like a cylindrical pipe with open ends. Also, the anisotropic etching of the first semiconductor layer 131, the memory layer 123, and the capping sacrificial layer 121*a* may be performed in an over-etch manner, and in this case, the lower semiconductor pattern 120 exposed by the first semiconductor pattern 132 may have a recessed top surface.

During the anisotropic etching process, the memory layer 123 and the capping sacrificial layer 121*a* may not be etched below the first semiconductor pattern 132, and in this case, each of the memory pattern 124 and the preliminary capping sacrificial pattern 121*b* may have a bottom portion interposed between the bottom surface of the first semiconductor pattern 132 and the top surface of the substrate 100. Furthermore, as a result of the anisotropic etching process may be performed to expose the top surface of the layered structure 110. Accordingly, the preliminary capping sacrificial pattern 121*b*, the memory pattern 124, and the first semiconductor pattern 132 may be locally formed in each of the vertical holes 116.

Figure 11:
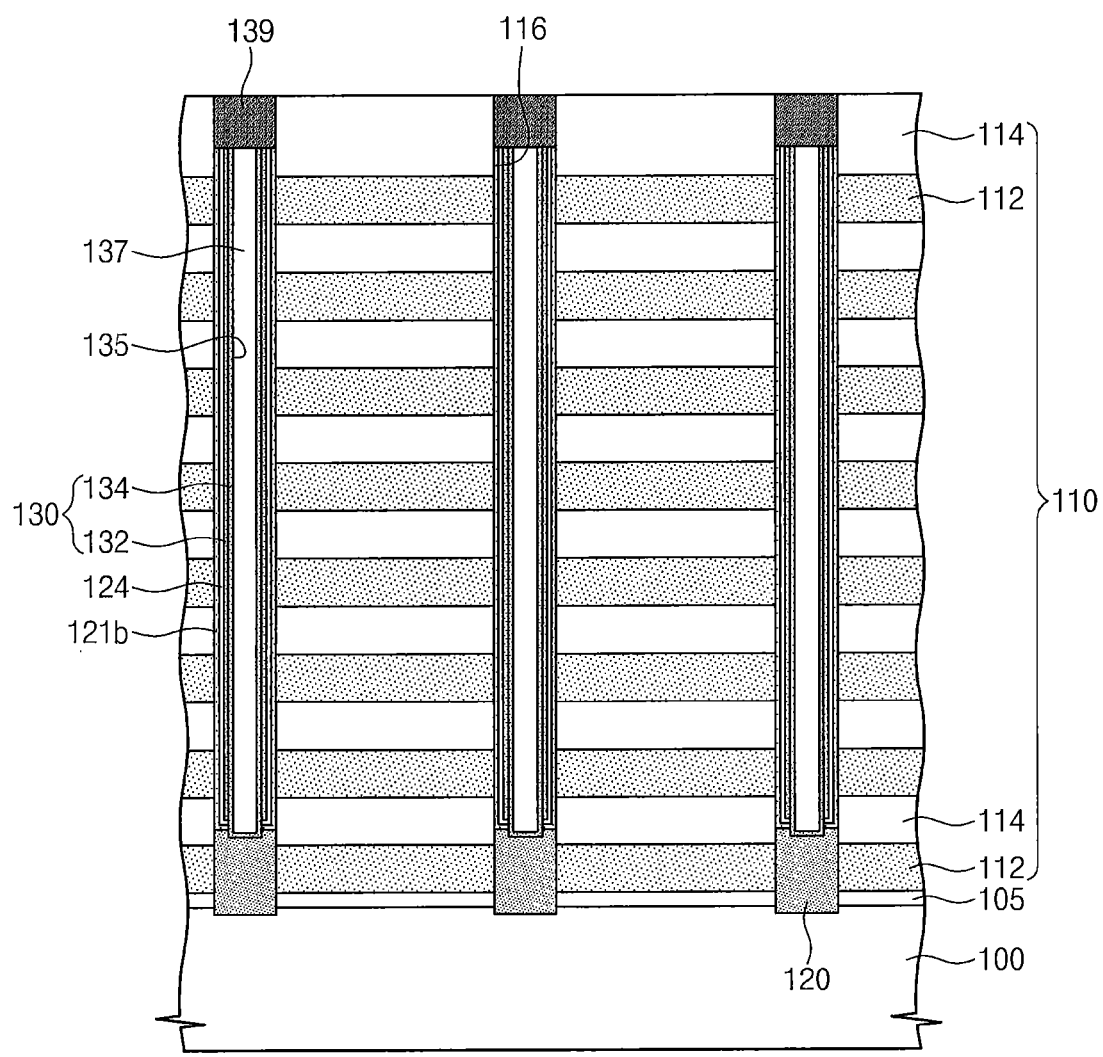
FIG. 11 is a sectional view taken along line I-I' of FIG. 4 to illustrate an operation in methods of fabricating a semiconductor device according to example embodiments of the inventive concept.

Referring to FIG. 11, the second semiconductor pattern 134 and the insulating gap-filling pattern 137 may be formed in the vertical holes 116 provided with the preliminary capping sacrificial pattern 121*b*, the memory pattern 124, and the first semiconductor pattern 132.

In example embodiments, the second semiconductor pattern 134 and the insulating gap-filling pattern 137 may be formed by sequentially forming a second semiconductor layer and an insulating gap-filling layer in the vertical holes 116 provided with the preliminary capping sacrificial pattern 121*b*, the memory pattern 124, and the first semiconductor pattern 132, and planarizing them to expose the top surface of the layered structure 110.

The second semiconductor layer may be formed of a semiconductor material (e.g., poly silicon, single crystalline silicon, and/or amorphous silicon), which may be formed using an atomic layer deposition (ALD) process and/or a chemical vapor deposition (CVD) process. In example embodiments, the second semiconductor layer may be conformally formed not to completely fill the vertical holes 116. The inner side surface of the second semiconductor layer may define the internal hole 135. In other example embodiments, unlike that illustrated in the drawings, the second semiconductor pattern 134 may be formed to completely fill the vertical holes 116. The first and second semiconductor patterns 132 and 134 may constitute the active pillar 130.

The insulating gap-filling pattern 137 may be formed to fill the internal hole 135 of the active pillar 130. The insulating gap-filling pattern 137 may be formed by a spin-on-glass (SOG) process and may be one of insulating materials and a silicon oxide layer.

Thereafter, the conductive pad 139 may be formed to be connected to the first and second semiconductor patterns 132 and 134. In example embodiments, the conductive pad 139 may be formed by recessing top portions of the first and second semiconductor patterns 132 and 134 and filling the recessed portions with a conductive material. In some embodiments, the formation of the conductive pad 139 may include doping the first and second semiconductor patterns 132 and 134 with impurities, whose conductivity type is different from the first and second semiconductor patterns 132 and 134. In this case, the conductive pad 139 may constitute a diode in conjunction with portions of the first and second semiconductor patterns 132 and 134 thereunder.

Figure 12:
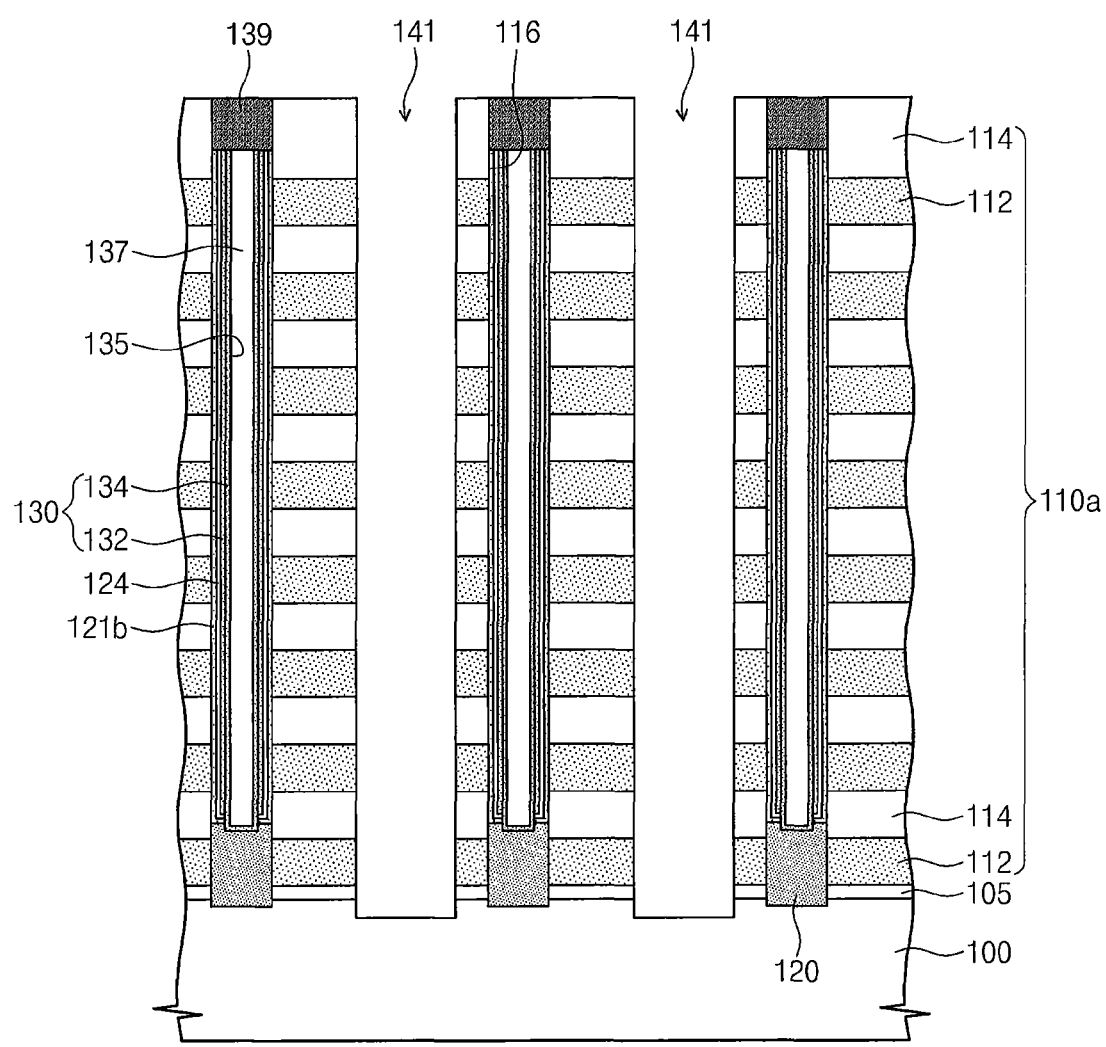
FIG. 12 is a sectional view taken along line I-I' of FIG. 4 to illustrate an operation in methods of fabricating a semiconductor device according to example embodiments of the inventive concept.

Referring to FIG. 12, the layered structure 110 may be patterned to form the isolation trench 141 exposing the substrate 100.

In example embodiments, the patterning of the layered structure 110 may include forming a mask pattern (not shown) on the layered structure 110 and etching the lower insulating layer 105, the sacrificial layers 112, and the insulating layers 114 using as an etch mask. As shown in FIG. 4, the isolation trench 141 may be shaped like a line or rectangle extending parallel to the first direction D1. The formation of the isolation trench 141 may be performed in an over-etch manner, and thus, the top surface of the substrate 100 exposed by the isolation trench 141 may be recessed to a specific depth.

As a result of the formation of the isolation trench 141, preliminary stacks 110a may be formed to include patterned structures of the sacrificial layers 112 and the insulating layers 114. Here, the insulating patterns 115 may refer to the patterned structures of the insulating layers 114. The preliminary stacks 110a may be formed to have a line shape extending parallel to the isolation trench 141 or the first direction D1, when viewed in a plan view. The isolation trench 141 may be formed to expose sidewalls of the insulating patterns 115 and the patterned structures of the sacrificial layers 112.

Figure 13A:
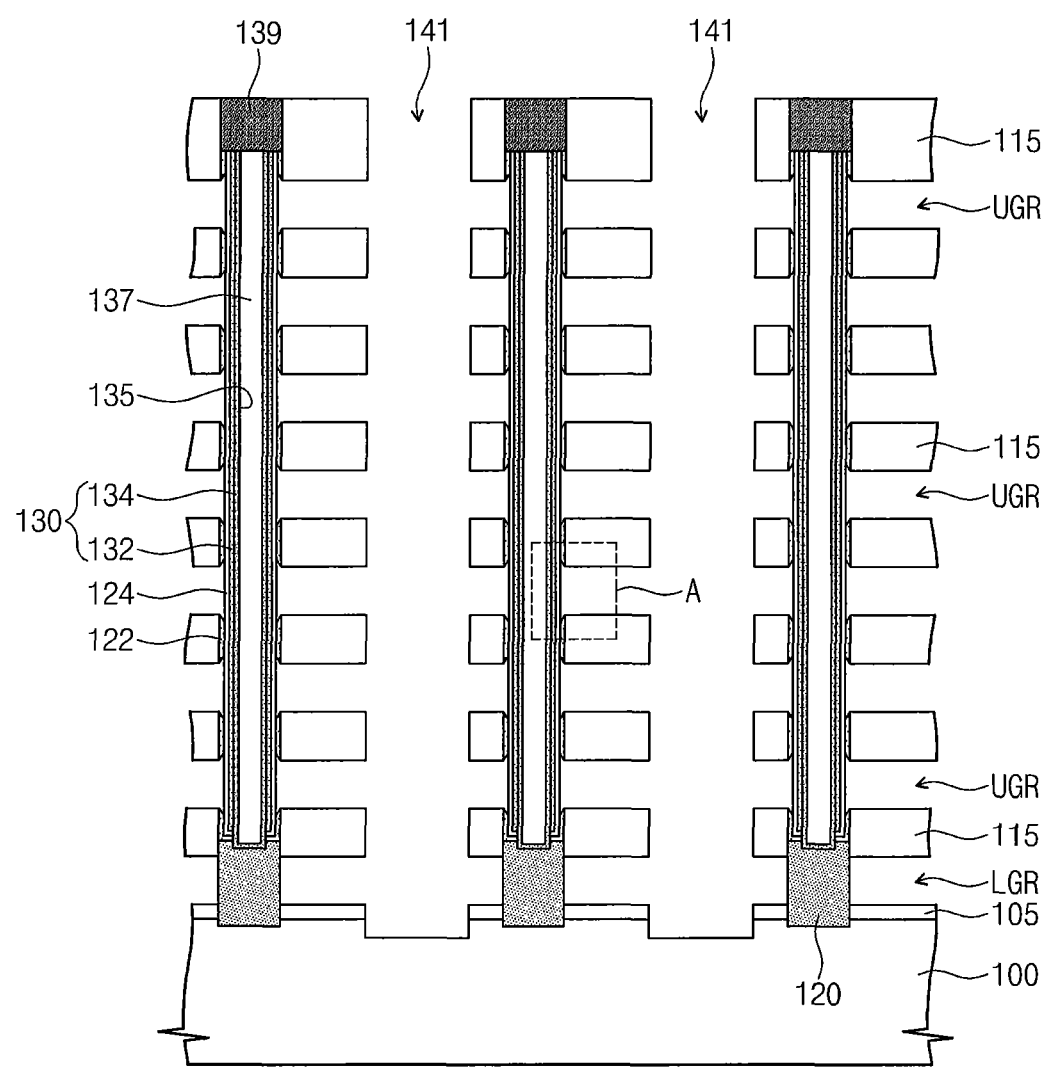
FIG. 13A is a sectional view taken along line I-I' of FIG. 4 to illustrate an operation in methods of fabricating a semiconductor device according to example embodiments of the inventive concept.
Figure 13B:
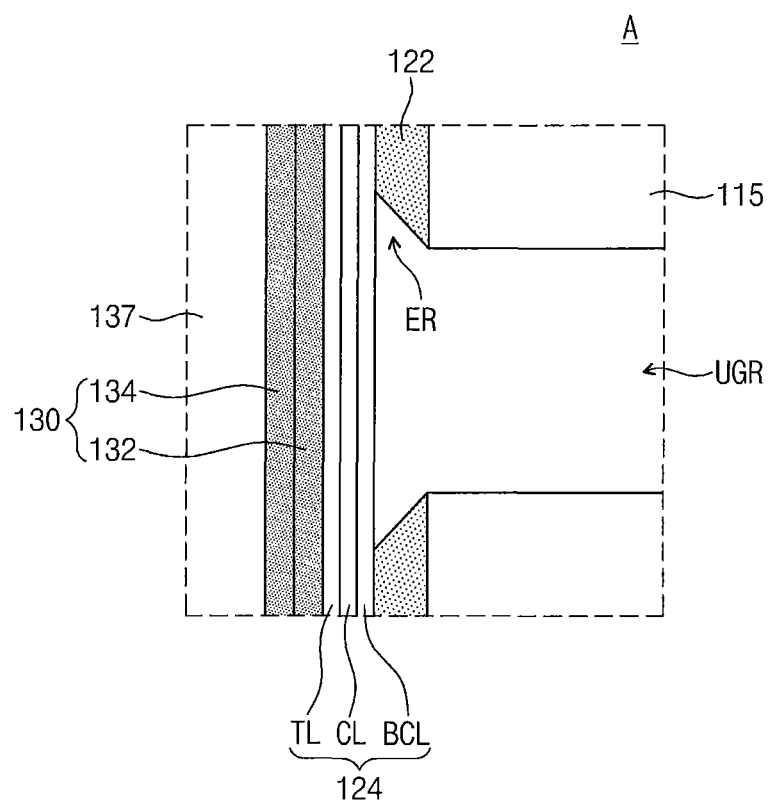
FIG. 13B is an enlarged view of portion A of FIG. 13A.

Referring to FIGS. 13A and 13B, the sacrificial layers 112 exposed by the isolation trench 141 may be removed to form gate regions between the insulating patterns 115. The gate regions may include a plurality of lower gate regions LGR, each of which is formed to partially expose a corresponding one of the lower semiconductor patterns 120, and a plurality of upper gate regions UGR, each of which is formed to expose a portion of the blocking insulating layer BCL.

In detail, the lower and upper gate regions LGR and UGR may be formed by an isotropic etching process for selectively removing the sacrificial layers 112. In the case where the sacrificial layers 112 are formed of a silicon nitride layer and the insulating patterns 115 are formed of a silicon oxide layer, the isotropic etching process may be performed using etching solution containing phosphoric acid. The isotropic etching process may be performed to completely remove the sacrificial layers 112. Furthermore, the isotropic etching process may be performed to additionally etch the preliminary capping sacrificial pattern 121b exposed by the removal of the sacrificial layers 112. Thus, the preliminary capping sacrificial pattern 121b exposed between the insulating patterns 115 may be etched to partially expose the blocking insulating layer BCL. In addition, between the blocking insulating layer BCL and the insulating patterns 115, the preliminary capping sacrificial pattern 121b may be partially etched to form empty spaces. Hereinafter, such empty spaces will be referred to as expanded regions ER. In other words, the expanded region ER may be included in the upper gate region UGR. According to example embodiments of the inventive concept, when viewed in a sectional view, each of the expanded regions ER may be formed have a sharp portion. When the lower and upper gate regions LGR and UGR are formed, the preliminary capping sacrificial pattern 121b may be divided by the upper gate regions UGR to form the capping sacrificial patterns 122 that are vertically separated from each other. As a result, the lower gate region LGR may be defined by the insulating patterns 115, which are disposed adjacent one another in the vertical direction, and a sidewall of the lower semiconductor pattern 120. The upper gate regions UGR may be defined by the insulating patterns 115 adjacent one another in the vertical direction, the capping sacrificial patterns 122 adjacent one another in the vertical direction, and a sidewall of the memory pattern (e.g., the blocking insulating layer BCL).

In some embodiments, the sidewall of the blocking insulating layer BCL exposed by the upper gate regions UGR is illustrated to be perpendicular to the top surface of the substrate 100, but example embodiments of the inventive concept are not limited thereto. For example, the sidewall of the blocking insulating layer BCL exposed by the upper gate regions UGR may have a rounded shape.

In example embodiments, since the preliminary capping sacrificial pattern 121b is formed of substantially the same material as the sacrificial layers 112, the preliminary capping sacrificial pattern 121b can be easily removed by the isotropic etching process for removing the sacrificial layers 112. Furthermore, an etch amount of the preliminary capping sacrificial pattern 121b positioned between the memory pattern 124 and the insulating patterns 115 may be controlled in the isotropic etching process, and this makes it easy to form the expanded region ER with the sharp portion.

Figure 14:
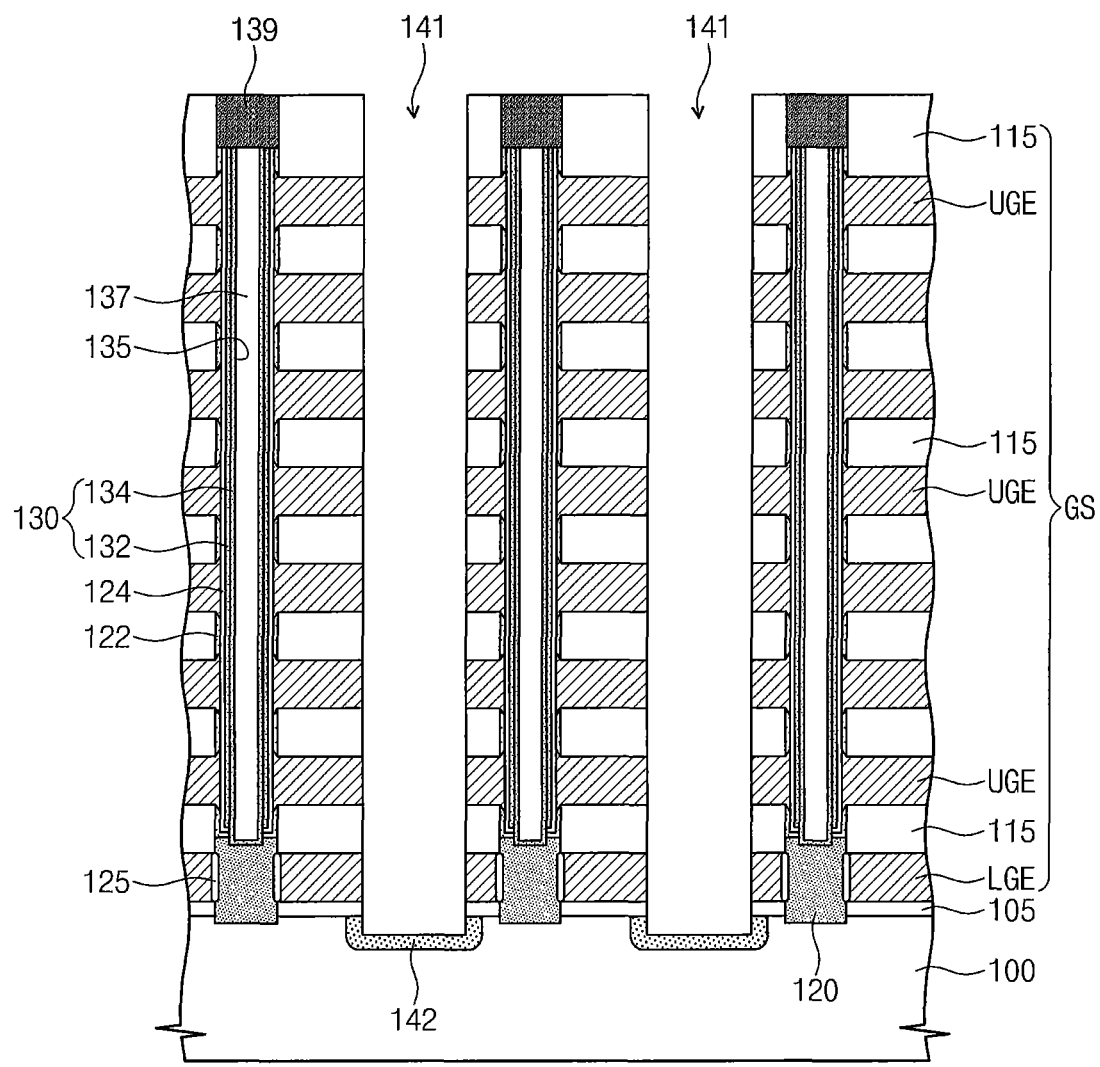
FIG. 14 is a sectional view taken along line I-I' of FIG. 4 to illustrate an operation in methods of fabricating a semiconductor device according to example embodiments of the inventive concept.

Referring to FIG. 14, a thermal oxidation may be performed on the lower semiconductor pattern 120 exposed by the lower gate region LGR to form the gate insulating layer 125 (e.g., made of a silicon oxide layer, or a silicon-germanium oxide layer).

Thereafter, by supplying a conductive material through the isolation trench 141, a conductive layer may be formed in the lower and upper gate regions LGR and UGR. The conductive layer may be formed of or include at least one of, for example, a doped poly-silicon layer, a metal layer (e.g., of tungsten), and/or a metal nitride layer. For example, the conductive layer may include a metal nitride layer and a metal layer thereon. The conductive layer may be formed by for example, a chemical vapor deposition (CVD) process.

The conductive layer may be removed from the outside of the lower and upper gate regions LGR and UGR (e.g., from the isolation trench 141). Accordingly, the lower gate electrode LGE and the upper gate electrodes UGE may be formed in the lower and upper gate regions LGR and UGR, respectively. In addition, the conductive layer may be removed from the bottom of the isolation trench 141 to partially expose the substrate 100. Dopants may be injected into the exposed portions of the substrate 100 to form the common source regions 142 that are highly-doped regions of the second conductivity type. In some embodiments, each of the upper gate electrodes UGE may be formed to have a sharp portion filling a corresponding one of the expanded regions ER.

In example embodiments, before the formation of the conductive layer, a blocking insulating layer may be formed to cover conformally inner surfaces of the lower and upper gate regions LGR and UGR. The blocking insulating layer may be formed of or include a silicon oxide layer and/or a high-k dielectric layer (e.g., of aluminum oxide or hafnium oxide). As an example, the second blocking insulating layer BCL2 described with reference to FIG. 6A may be used as the blocking insulating layer provided in the upper gate regions UGR.

Referring back to FIGS. 4 and 5, the insulating spacer 143 may be formed on a sidewall of the isolation trench 141. The insulating spacer 143 may be formed by depositing and anisotropically etching a silicon oxide layer and/or a silicon nitride layer.

The device isolation pattern 145 may be formed to fill the isolation trench 141. The device isolation pattern 145 may be formed to extend along the isolation trench 141 or parallel to the first direction D1. The device isolation pattern 145 may include a silicon oxide layer. The device isolation pattern 145 may be formed to have a top surface coplanar with that of the uppermost one of the insulating patterns 115.

The strapping plugs 140 may be formed in the device isolation pattern 145. Furthermore, the barrier layer 148 may be formed between the device isolation pattern 145 and the strapping plugs 140. The strapping plugs 140 may include a metallic layer (e.g., of tungsten, copper, or aluminum). The barrier layer 148 may include a conductive metal nitride layer (e.g., of titanium nitride and/or tantalum nitride). The strapping plugs 140 may be electrically connected to the common source regions 142 via common contacting layers (not shown).

The first contacts 162 may be formed to be connected to the strapping plugs 140. The strapping line 160 may be formed on and connected to the first contacts 162. The strapping line 160 may be formed to be parallel to the first direction D1. The strapping line 160 may be electrically connected to the strapping plugs 140 through the first contacts 162. The strapping line 160 and the first contacts 162 may include at least one selected from the group consisting of metals (e.g., tungsten, copper, and/or aluminum), conductive metal nitrides (e.g., titanium nitride and/or tantalum nitride), and/or transition metals (e.g., titanium and/or tantalum).

The second contacts 164 may be formed on and connected to the active pillars 130. The bit lines BL may be formed on the second contacts 164 to connect the second contacts 164 to each other. The bit lines BL may extend in the second direction D2. The bit lines BL may be electrically connected to the active pillars 130 through second contacts 164. The bit lines BL and the second contacts 164 may include at least one selected from the group consisting of metals (e.g., tungsten, copper, and/or aluminum), conductive metal nitrides (e.g., titanium nitride and/or tantalum nitride), and/ or transition metals (e.g., titanium and/or tantalum).

The third contacts 166 may be formed on and connected to the strapping line 160. The common source line CSL may be formed on the third contacts 166 to connect the third contacts 166 to each other. Accordingly, the common source line CSL may be electrically connected to the strapping line 160 through third contacts 166. The common source line CSL and the third contacts 166 may include at least one selected from the group consisting of metals (e.g., tungsten, copper, and/or aluminum), conductive metal nitrides (e.g., titanium nitride and/or tantalum nitride), and/or transition metals (e.g., titanium and/or tantalum).

Figure 15:
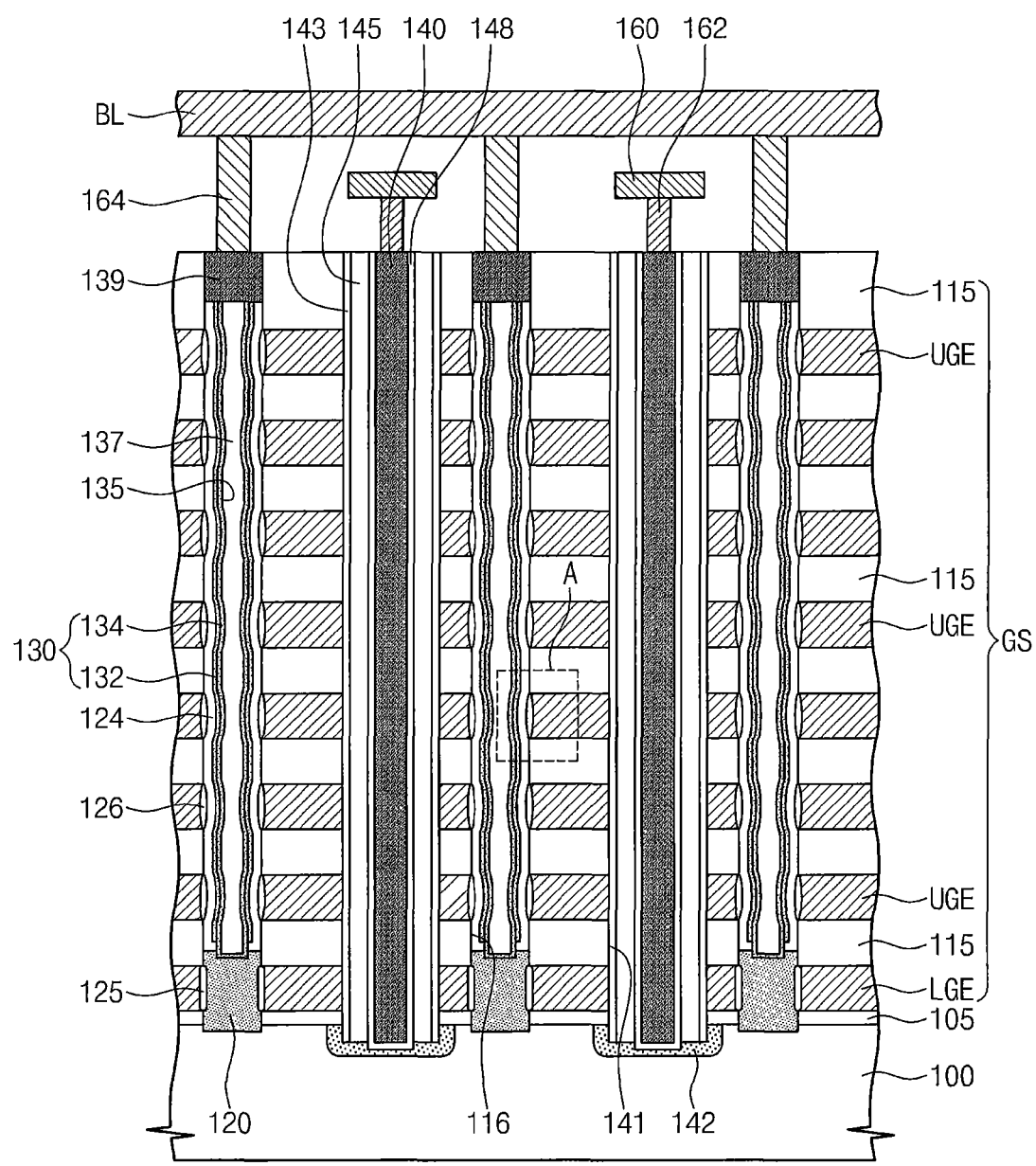
FIG. 15 is a sectional view taken along line I-I' of FIG. 4 to illustrate a semiconductor device according to other example embodiments of the inventive concept.
Figure 16A:
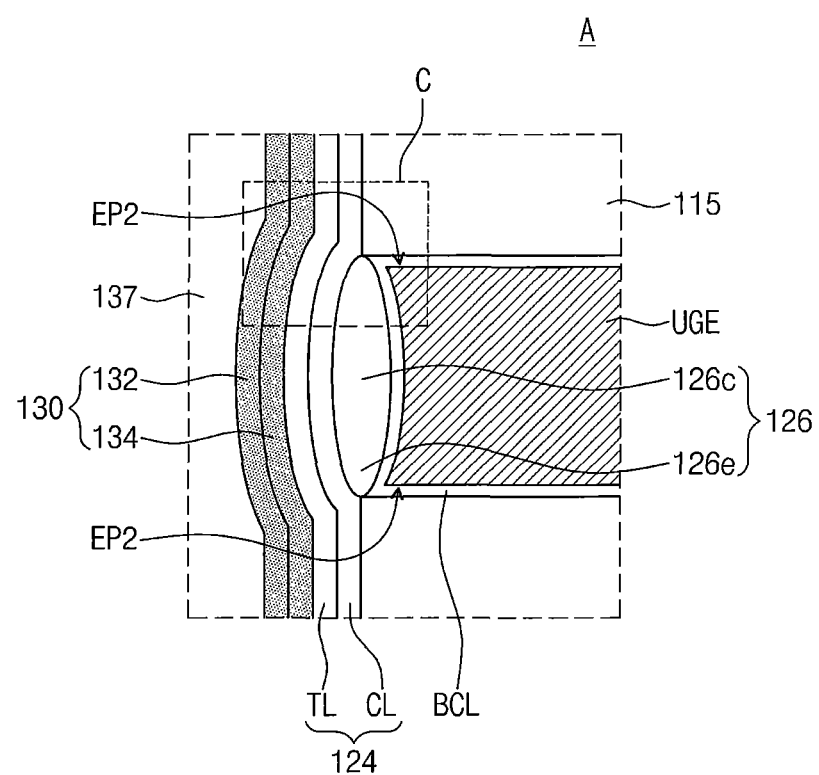
FIG. 16A is an enlarged view of a portion A of FIG. 15
Figure 16B:
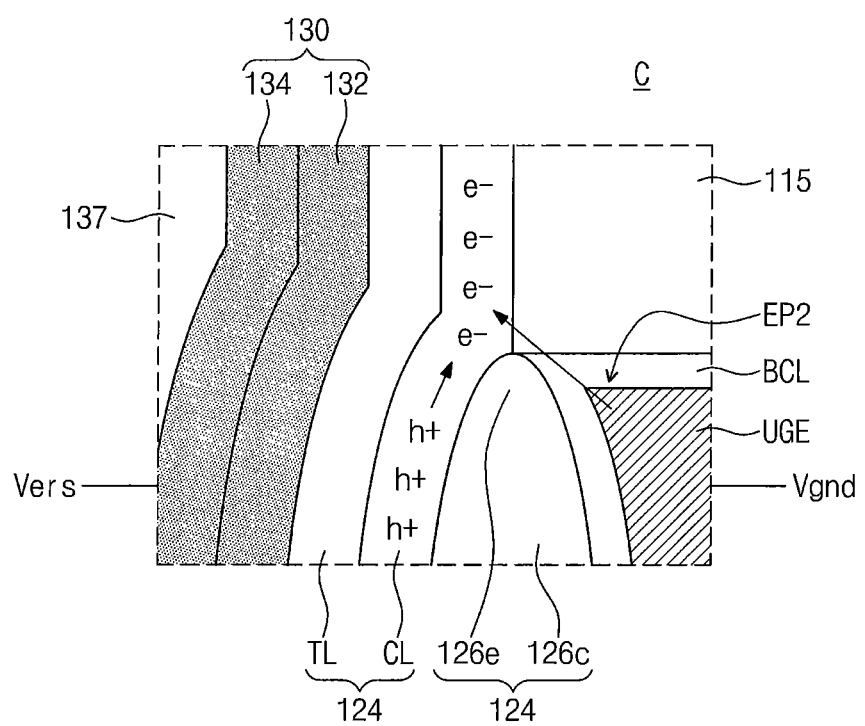
FIG. 16B is an enlarged view corresponding to a portion C of FIG. 16A.

FIG. 15 is a sectional view taken along line I-I' of FIG. 4 to illustrate a semiconductor device according to other example embodiments of the inventive concept. FIG. 16A is an enlarged view of a portion A of FIG. 15 and FIG. 16B is an enlarged view corresponding to a portion C of FIG. 16A. In the following description, a previously-described element may be identified by a similar or identical reference number without repeating an overlapping description thereof, for the sake of brevity.

Referring to FIGS. 4 and 15, the memory pattern 124 may be interposed between the upper gate electrodes UGE and the active pillars 130. Buffer oxide patterns 126 may be interposed between the memory pattern 124 and the upper gate electrodes UGE. In the some embodiments, the memory pattern 124 may include a charge storing layer CL adjacent to the upper gate electrodes UGE and a tunnel insulating layer TL adjacent the active pillars 130.

For example, the buffer oxide patterns 126 may be isolated between the charge storing layer CL and the upper gate electrodes UGE to have an island shape. A portion of the buffer oxide patterns 126 may be positioned between the insulating patterns 115 adjacent one another in the vertical direction, and another portion thereof may protrude into the vertical hole 116 or toward the charge storing layer CL. When viewed in a sectional view, each of the buffer oxide patterns 126 may have both sidewalls, one of which is convex toward the upper gate electrodes UGE, and the other of which is convex toward the charge storing layer CL. In other words, the buffer oxide patterns 126 may have end portions 126e, which are positioned adjacent the insulating patterns 115, and a center portion 126c, which is positioned between the end portions 126e and has a thickness larger than that of the end portions 126e. The buffer oxide patterns 126 may be formed of at least one of oxide materials (e.g., silicon oxide). The buffer oxide patterns 126 between the charge storing layer CL and the upper gate electrodes UGE may serve as a blocking insulating layer.

The charge storing layer CL may be provided on the sidewall of the vertical hole 116 provided with the buffer oxide patterns 126. The charge storing layer CL may cover the convex sidewalls of the buffer oxide patterns 126 protruding into the vertical hole 116 and may extend along the sidewall of the vertical hole 116 and in the vertical direction. A portion of the charge storing layer CL horizontally overlapped with the buffer oxide patterns 126 may have a rounded sidewall. Accordingly, when viewed in a sectional view, the charge storing layer CL may be provided to have a vertical, but partially-bending, profile with respect to the substrate 100.

The tunnel insulating layer TL may be provided on the sidewall of the charge storing layer CL and may extend in the vertical direction. The tunnel insulating layer TL may be formed to have substantially the same sectional profile as that of the charge storing layer CL. In other words, a portion of the tunnel insulating layer TL horizontally overlapped with the buffer oxide patterns 126 may have a rounded sidewall. Accordingly, when viewed in a vertically sectioned view, the tunnel insulating layer TL may be provided to have a vertical, but partially-bending, profile with respect to the substrate 100.

An inner sidewall of the active pillar 130 may have a section profile similar to that of the charge storing layer CL. Accordingly, the internal hole 135 defined by the inner sidewall of the active pillar 130 may include regions with at least two different diameters. For example, a diameter of the internal hole 135 may be smaller at a level of the buffer oxide pattern 126 than at a level of the insulating pattern 115.

The blocking insulating layer BCL may be interposed between the buffer oxide patterns 126 and the upper gate electrodes UGE and between the insulating patterns 115 and the upper gate electrodes UGE. In other words, the blocking insulating layer BCL may be interposed between the upper gate electrodes UGE and the buffer oxide patterns 126 to cover top and bottom surfaces of the upper gate electrodes UGE. The blocking insulating layer BCL may be formed of or include a high-k dielectric material (e.g., aluminum oxide and/or hafnium oxide). In other words, the blocking insulating layer BCL may be formed of or include a material whose dielectric constant is higher than that of the buffer oxide pattern 126. The blocking insulating layer BCL may be a multi-layered structure including a plurality of thin layers.

According to example embodiments of the inventive concept, the sidewalls of the upper gate electrodes UGE facing the buffer oxide patterns 126 may have a laterally concave shape. For example, the sidewall of the upper gate electrode UGE adjacent the buffer oxide pattern 126 may have a concave shape in a direction away from the buffer oxide patterns 126. Accordingly, the upper gate electrode UGE adjacent the buffer oxide pattern 126 may include a portion protruding toward the buffer oxide pattern 126. For example, the upper gate electrodes UGE may have corner portions EP2, which are formed adjacent the end portions 126*e* of the buffer oxide patterns 126, and each of which is sharply protruded toward the buffer oxide patterns 126. Such a sharp shape of the corner portion EP2 of the upper gate electrode UGE may make it possible to concentrate an electric field on the corner portion EP2, when an erase operation is performed on the semiconductor device. Accordingly, it is easy to cause a back tunneling of electrons, during the erase operation on the semiconductor device. In detail, the erase operation on the semiconductor device may be performed by applying erase and ground voltages Vers and Vgnd to the active pillar 130 (or the substrate 100) and the upper gate electrode UGE, respectively, and in this case, an electric field may be concentrated on the corner portions EP2 of the upper gate electrodes UGE, as shown in FIG. 16B. Accordingly, the back tunneling of electrons may occur through the corner portions EP2 of the upper gate electrodes UGE; that is, electrons (e−) may be easily injected into the charge storing layer CL adjacent the corner portions EP2. The injected electrons (e−) may prevent or suppress holes (h+) trapped in the charge storing layer CL from being vertically spread, during the erase operation of the semiconductor device. Furthermore, the charge storing layer CL may be formed to have a curved profile, and it is possible to further suppress or prevent holes (h+) trapped in the charge storing layer CL from being vertically spread. This makes it possible to suppress electric charges (i.e., holes) stored in the charge storing layer from being lost and thereby to improve a charge retention property of the semiconductor device. As a result, the semiconductor device can have an improved reliability property.

Hereinafter, methods of fabricating a semiconductor device according to other example embodiments of the inventive concept will be described. FIGS. 17 through 20 are sectional views taken along line I-I' of FIG. 4 to illustrate a method of fabricating a semiconductor device according to other example embodiments of the inventive concept.

Figure 17:
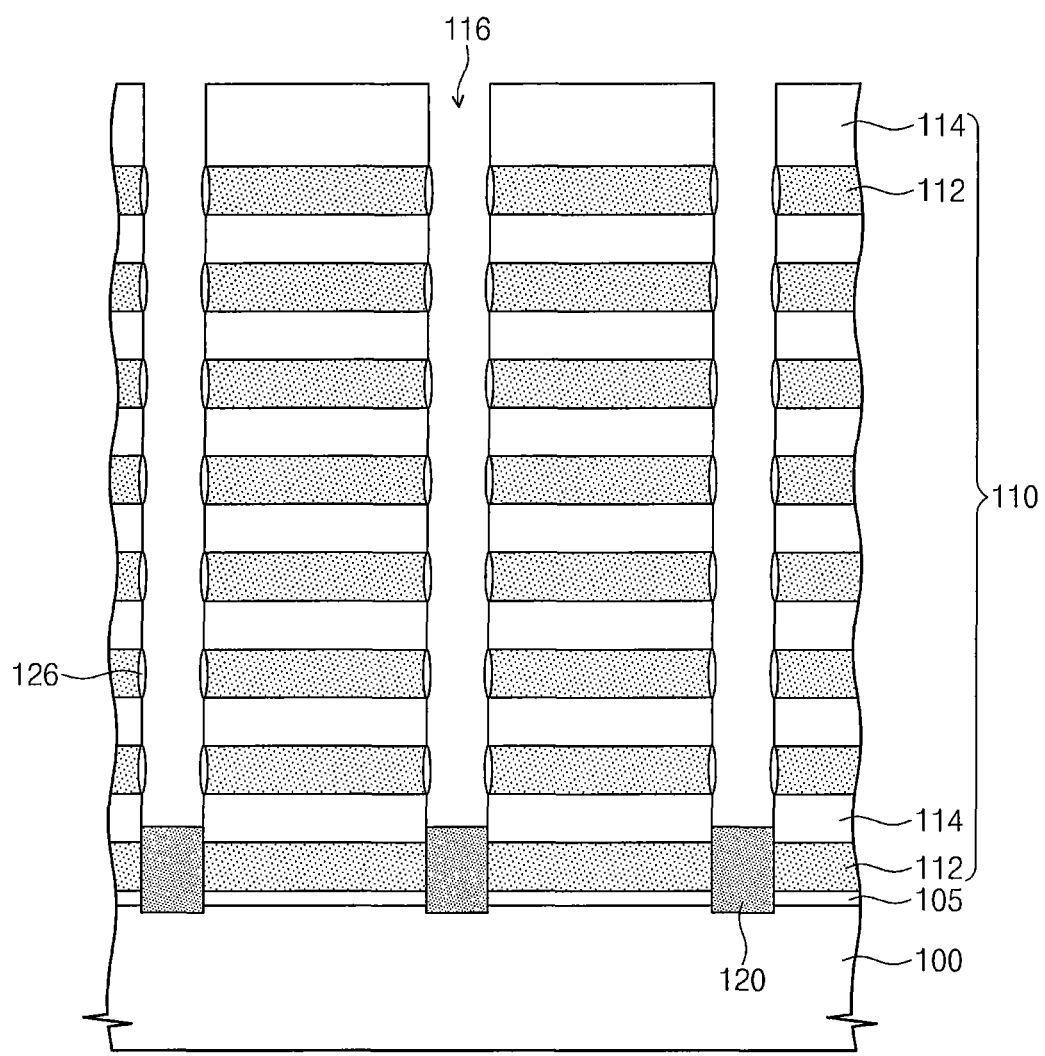
FIG. 17 is a sectional view taken along line I-I' of FIG. 4 to illustrate an operation in methods of fabricating a semiconductor device according to other example embodiments of the inventive concept.

Referring to FIG. 17, an oxidation process may be performed on the structure of FIG. 8. For example, the oxidation process may be a radical oxidation process. As a result of the oxidation process, the sacrificial layers 112 exposed by the vertical holes 116 may be oxidized to form the buffer oxide patterns 126. The buffer oxide patterns 126 may be formed of or include, for example, silicon oxide.

The buffer oxide patterns 126 may be formed on surfaces of the sacrificial layers 112 exposed by the vertical holes 116. In the case where, as exemplified above, the insulating layers 114 are formed of a silicon oxide layer and the sacrificial layers 112 are formed of a material (e.g., silicon nitride or silicon) different from the silicon oxide layer, the oxidation process may be performed to form the oxide layer on only the exposed surfaces of the sacrificial layers 112. Each of the buffer oxide patterns 126 may include a sidewall protruding toward the vertical hole 116.

When viewed in a sectional view, each of the buffer oxide patterns 126 may have both sidewalls, which are provided to face each other, and each of which has a rounded shape. For example, as previously described with reference to FIG. 16A, each of the buffer oxide patterns 126 may have the end portions 126*e*, which are positioned adjacent the insulating patterns 115, and the center portion 126*c*, which is positioned between the end portions 126*e* and has a thickness larger than that of the end portions 126*e*.

Although not shown, as a result of the oxidation process, the top surfaces of the lower semiconductor patterns 120 exposed by the vertical holes 116 may be partially oxidized. Such an oxide layer formed on the lower semiconductor patterns 120 may be removed by a subsequent process (e.g., a cleaning process).

Figure 18:
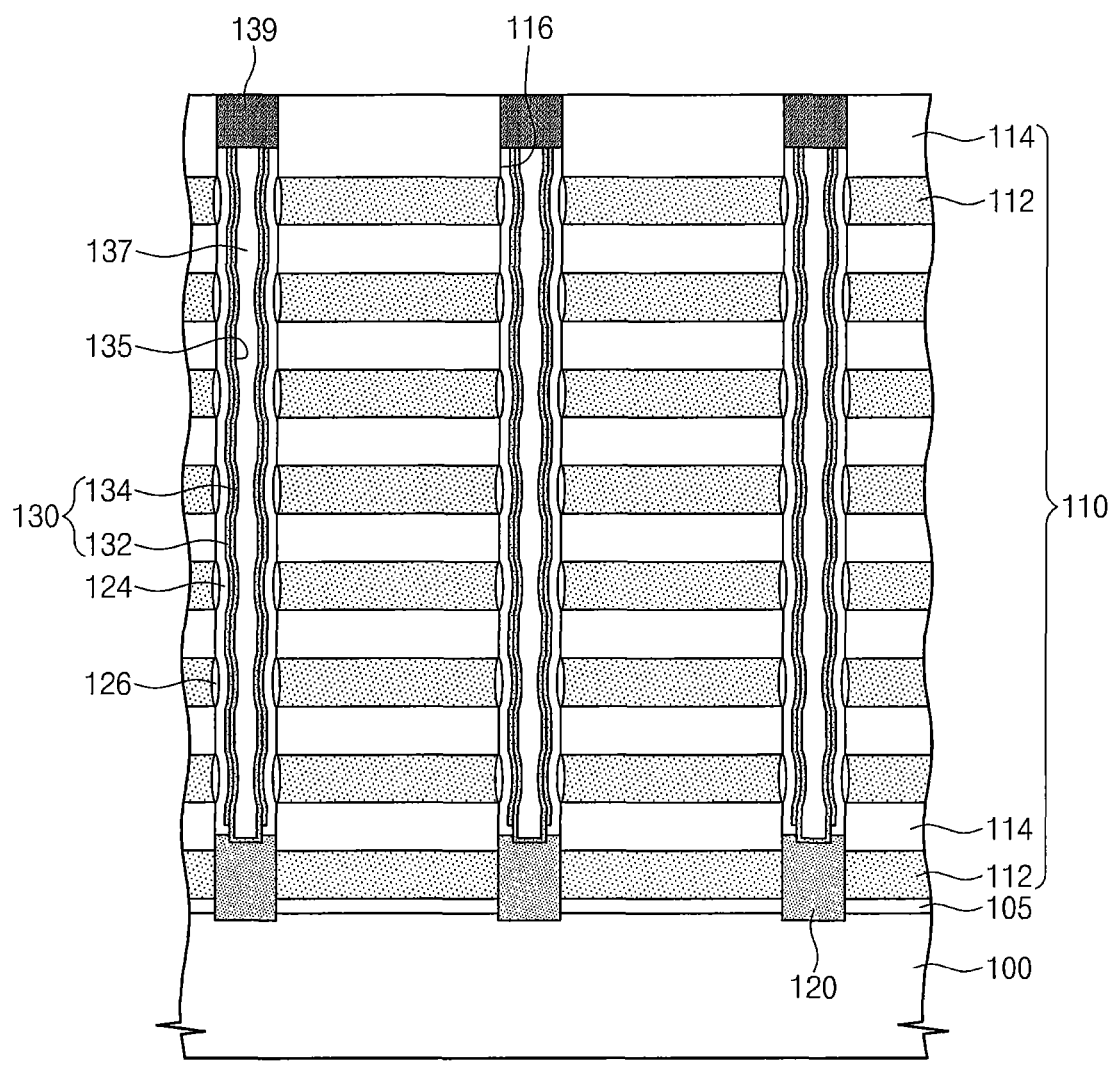
FIG. 18 is a sectional view taken along line I-I' of FIG. 4 to illustrate another operation in methods of fabricating a semiconductor device according to other example embodiments of the inventive concept.

Referring to FIG. 18, the memory pattern 124 may be formed in the vertical holes 116 provided with the buffer oxide patterns 126. The memory pattern 124 may be formed to cover the sidewall of the buffer oxide pattern 126 protruding into the vertical hole 116 and to extend along the sidewall of the vertical hole 116 or in the vertical direction. Accordingly, when viewed in a vertically sectioned view, the memory pattern 124 may be provided to have a vertical, but partially-bending, profile with respect to the substrate 100. The memory pattern 124 may include the charge storing layer CL and the tunnel insulating layer TL described with reference to FIG. 16A.

The active pillars 130 may be formed on the sidewalls of the vertical holes 116 provided with the memory pattern 124. The inner sidewall of the active pillar 130 may have a section profile similar to that of the memory pattern 124. Accordingly, the internal hole 135 defined by the inner sidewall of the active pillar 130 may include regions with at least two different diameters. For example, a diameter of the internal hole 135 may be smaller at a level of the buffer oxide pattern 126 than at a level of the insulating pattern 115. The internal hole 135 may be filled with the insulating gap-filling pattern 137. The insulating gap-filling pattern 137 may be formed of or include, for example, a silicon oxide layer. The active pillars 130 may include the first semiconductor pattern 132 and the second semiconductor pattern 134.

The conductive pad 139 may be formed on each of the active pillars 130. In example embodiments, the conductive pad 139 may be formed by recessing top portions of the active pillars 130 and then filling the recessed portions with a conductive material. In some embodiments, the formation of the conductive pad 139 may include doping the active pillars 130 with impurities, whose conductivity type is different from the active pillars 130. In this case, the conductive pad 139 may constitute a diode in conjunction with the active pillar 130 positioned thereunder.

Here, the memory pattern 124, the active pillars 130, the insulating gap-filling pattern 137, and the conductive pad 139 may be formed by the same or similar method described with reference to FIGS. 9A, 9B, 10, and 11.

Figure 19:
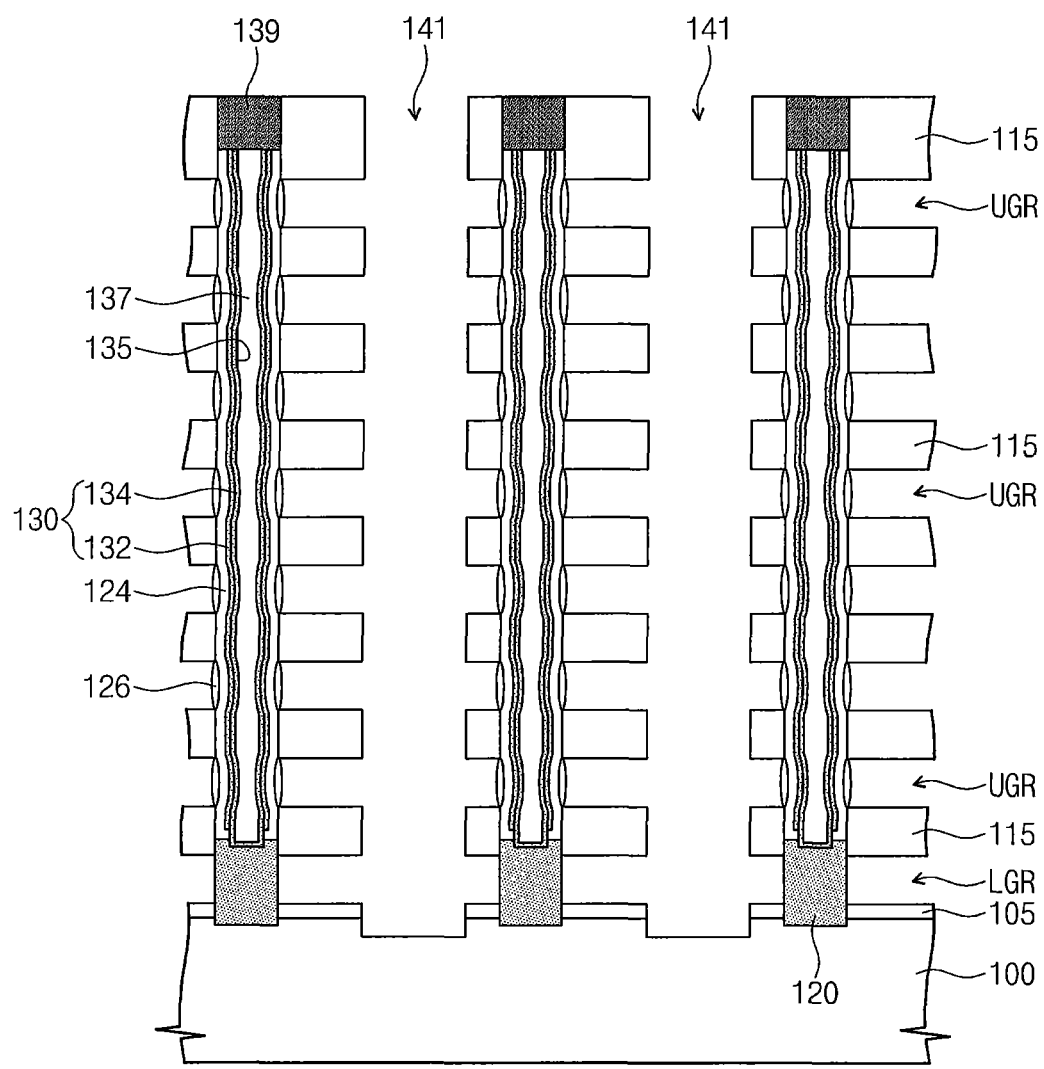
FIG. 19 is a sectional view taken along line I-I' of FIG. 4 to illustrate another operation in methods of fabricating a semiconductor device according to other example embodiments of the inventive concept.

Referring to FIG. 19, the layered structure 110 may be patterned to form the isolation trench 141 exposing the substrate 100. Thereafter, the sacrificial layers 112 exposed by the isolation trench 141 may be removed to form gate regions between the insulating patterns 115. The gate regions may include a plurality of lower gate regions LGR, each of which is formed to partially expose a corresponding one of the lower semiconductor patterns 120, and a plurality of upper gate regions UGR, each of which is formed to expose a portion of the buffer oxide pattern 126. The isolation trench 141 and the lower and upper gate regions LGR and UGR may be formed by the same or similar method described with reference to FIGS. 12, 13A, and 13B. However, according to some embodiments, the isotropic etching process for removing the sacrificial layers 112 may be performed, without the removal step of the preliminary capping sacrificial patterns 121b described with reference to FIGS. 13A and 13B.

Figure 20:
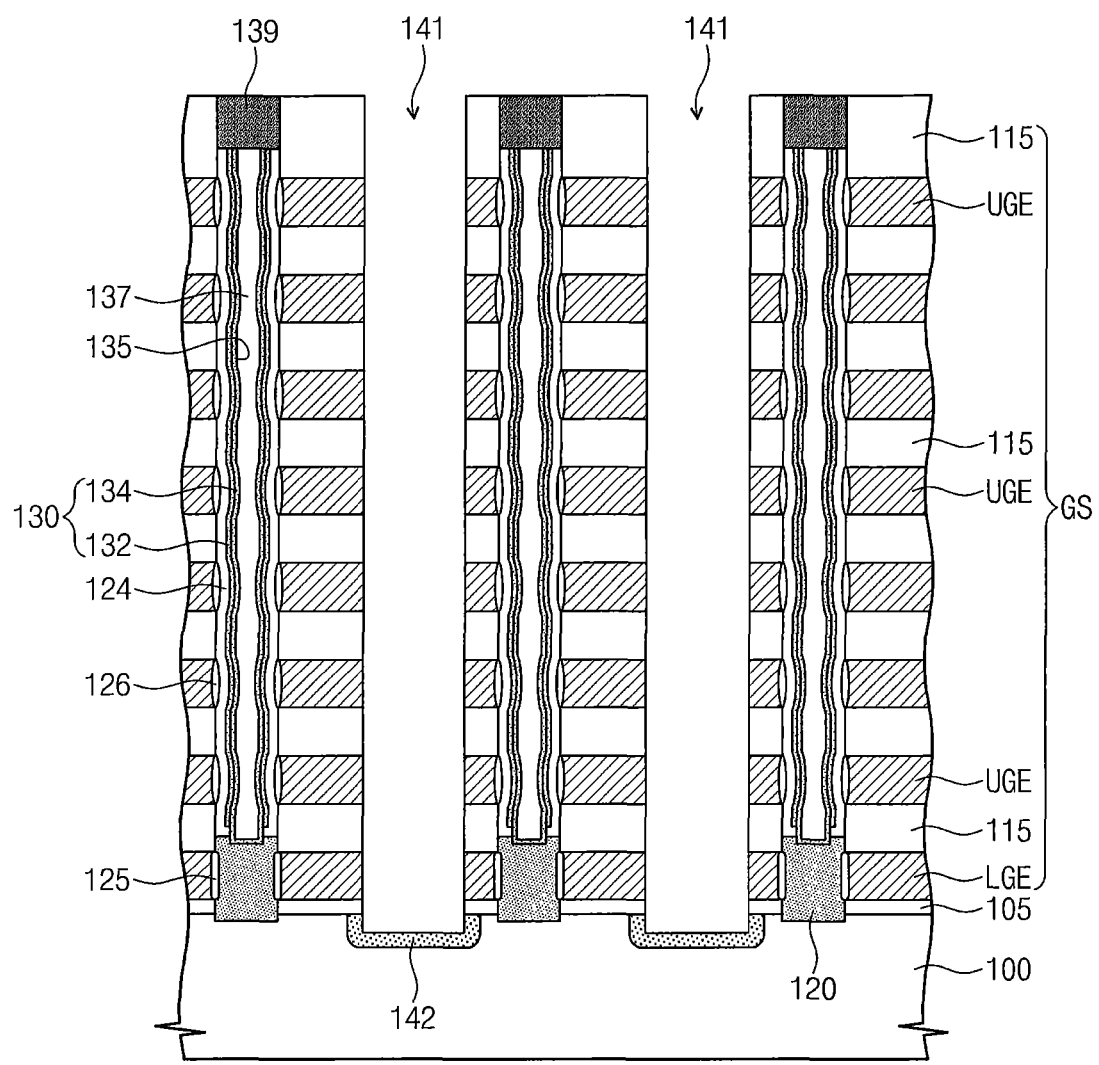
FIG. 20 is a sectional view taken along line I-I' of FIG. 4 to illustrate another operation in methods of fabricating a semiconductor device according to other example embodiments of the inventive concept.

Referring to FIG. 20, a thermal oxidation may be performed on the lower semiconductor pattern 120 exposed by the lower gate region LGR to form the gate insulating layer 125 (e.g., made of a silicon oxide layer, or a silicon-germanium oxide layer). Thereafter, the lower gate electrode LGE and the upper gate electrodes UGE may be formed in the lower and upper gate regions LGR and UGR, respectively. The lower and upper gate electrodes LGE and UGE may be formed by the same or similar method described with reference to FIG. 15. After the formation of the lower and upper gate electrodes LGE and UGE, dopants may be injected into the substrate 100 exposed by the isolation trench 141 to form the common source regions 142 that are highly-doped regions of the second conductivity type.

In some embodiments, before the formation of the lower gate electrode LGE and the upper gate electrodes UGE, the blocking insulating layer BCL may be formed in the lower and upper gate regions LGR and UGR, as described with reference to FIG. 16A. The blocking insulating layer BCL may be formed to conformally cover inner surfaces of the lower and upper gate regions LGR and UGR. The blocking insulating layer BCL may be formed of or include at least one of silicon oxide or high-k dielectric materials (e.g., aluminum oxide or hafnium oxide) and may be formed by a chemical vapor deposition process or an atomic layer deposition process. The blocking insulating layer BCL may be formed to have a multi-layered structure including a plurality of thin layers.

Except for these features, the semiconductor device may be configured to have substantially the same features as that described with reference to FIGS. 4 and 5, and a detailed description thereof will be omitted.

Figure 21:
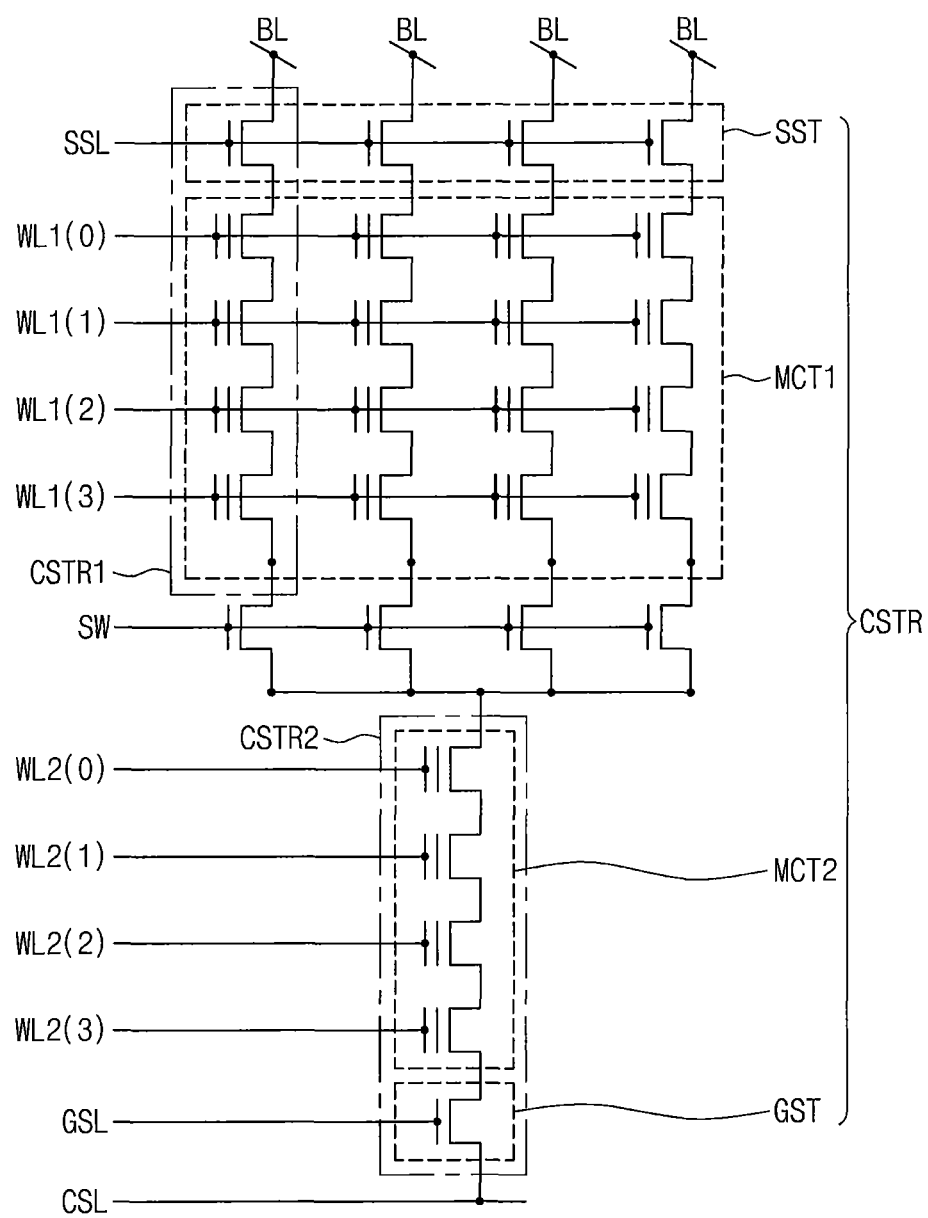
FIG. 21 is a schematic circuit diagram of a cell array, which may be provided in each of the memory block of FIG. 2, according to still other example embodiments of the inventive concept.

FIG. 21 is a schematic circuit diagram of a cell array, which may be provided in each of the memory block of FIG. 2, according to still other example embodiments of the inventive concept.

Referring to FIG. 21, a cell array of a semiconductor device according to some embodiments may include a common source line CSL, a plurality of bit lines BL, and a cell string CSTR between the common source line CSL and the bit lines BL.

The common source line CSL may be a conductive layer provided on a substrate, and the bit lines BL may be conductive patterns (e.g., metal lines) disposed on the substrate.

The cell string CSTR may include a plurality of upper strings CSTR1, which are respectively connected to the bit lines BL, and a single lower string CSTR2, which is connected to the common source line CSL. The plurality of upper strings CSTR1 may be connected in common to the single lower string CSTR2. The upper strings CSTR1 may be connected in common to the lower string CSTR2 through at least one switching device SW. The at least one switching device SW connected to the upper strings CSTR1 may be configured in such a way that the same voltage is applied thereto.

Each of the upper strings CSTR1 may include a string selection transistor SST connected to a corresponding one of the bit lines BL and a plurality of upper memory cell transistors MCT1 disposed between the string selection transistor SST and the switching device SW. The string selection transistor SST may be connected in series to the upper memory cell transistors MCT1. The lower string CSTR2 may include the ground selection transistor GST coupled to the common source line CSL and a plurality of lower memory cell transistors MCT2 disposed between the ground selection transistor GST and the switching devices SW. The ground selection transistor GST may be connected in series to the lower memory cell transistors MCT2.

The string selection line SSL and upper word lines WL1(0)-WL1(3), which are disposed between the bit lines BL and the switching devices SW, may be respectively used for gate electrodes of the string selection transistor SST and the upper memory cell transistors MCT1. The ground selection line GSL and lower word lines WL2(0)-WL2(3), which are disposed between the common source line CSL and the switching devices SW, may be respectively used for gate electrodes of the ground selection transistor GST and the lower memory cell transistors MCT2. Each of the upper and lower memory cell transistors MCT1 and MCT2 may include a data storing element or a memory layer.

The plurality of upper strings CSTR1 connected to respective bit lines may be connected in common to a single lower string CSTR2 connected to a common source line. Thus, the ground selection transistor GST of the single lower string CSTR2 may be shared by the upper strings CSTR1 including the string selection transistors SST, which are respectively coupled to the bit lines BL. Since the ground selection transistor GST of the single lower string CSTR2 is shared by the upper strings CSTR1, which are connected to respective bit lines and are independently operated, it possible to increase an integration density of the semiconductor device.

Figure 22:
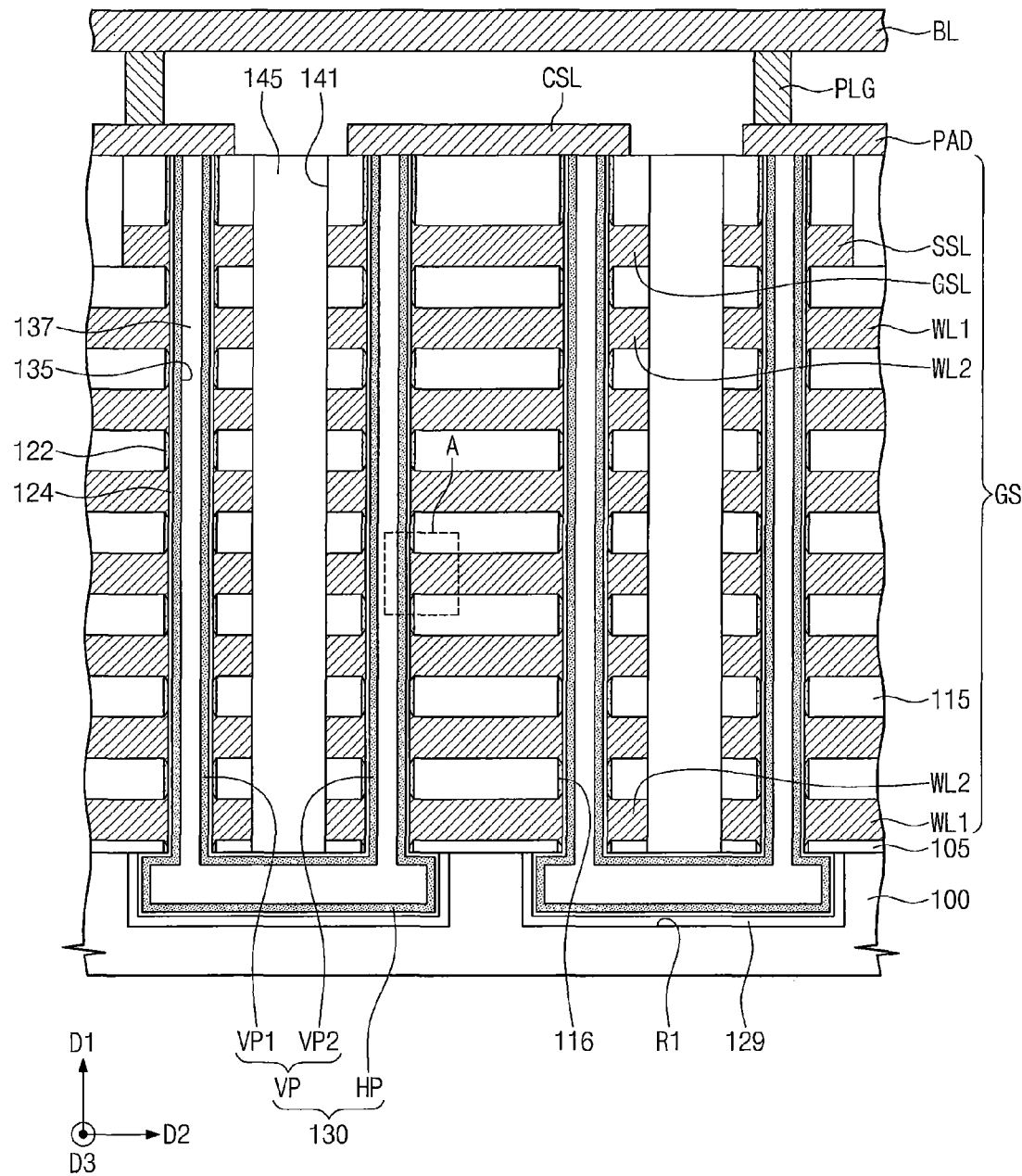
FIG. 22 is a sectional view illustrating a semiconductor device according to even other example embodiments of the inventive concept.
Figure 23:
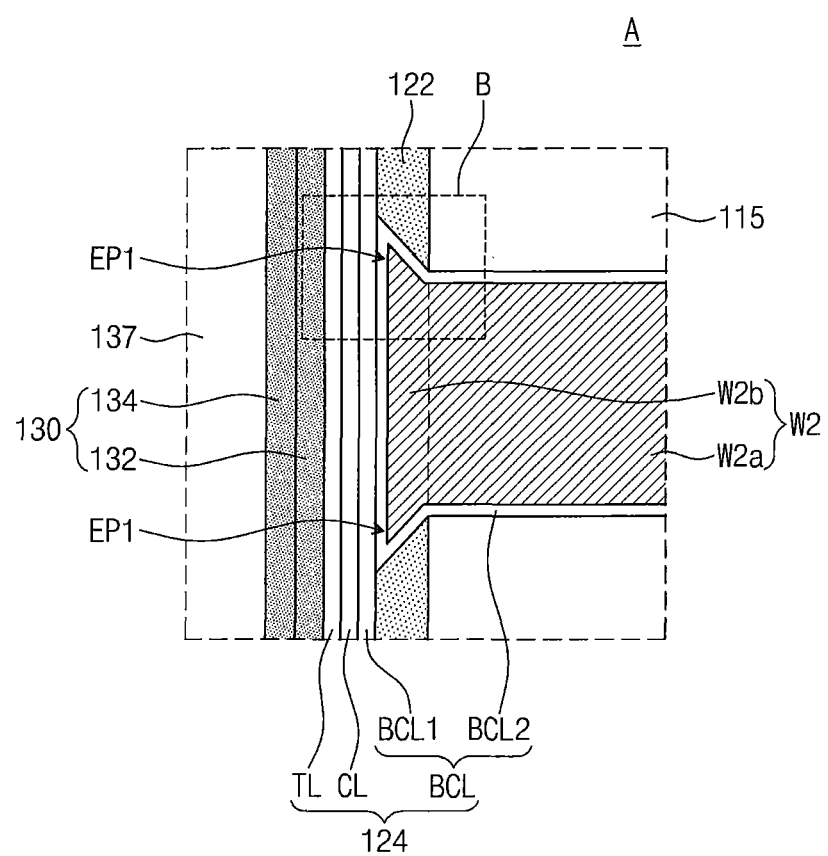
FIG. 23 is an enlarged view of a portion A of FIG. 22.

FIG. 22 is a sectional view illustrating a semiconductor device according to some other example embodiments of the inventive concept, and FIG. 23 is an enlarged view of a portion A of FIG. 22. In the following description, a previously-described element may be identified by a similar or identical reference number without repeating an overlapping description thereof, for the sake of brevity.

Referring to FIG. 22, a semiconductor device according to some embodiments may include the bit lines BL on the substrate 100, the stack GS between the substrate 100 and the bit lines BL, the common source line CSL between the stack GS and the bit lines BL, and a plurality of the active pillars 130 penetrating the stack GS. Each of the active pillars 130 may connect a corresponding one of the bit lines BL to the common source line CSL. Contact plugs PLG and pads PAD may be provided between the stack GS and the bit lines BL to provide electrical connection paths therebetween. The lower insulating layer 105 may be provided between the substrate 100 and the stack GS. The lower insulating layer 105 may be formed of or include a silicon oxide layer.

The stack GS may extend along the first direction D1. In example embodiments, a plurality of the stacks GS may be provided spaced apart from each other in the second direction D2 (for example, across or perpendicular to the first direction) by the isolation trench 141 extending the first direction. The stack GS may include the insulating patterns 115 and the gate electrodes between the insulating patterns 115. The gate electrodes may include at least one of doped silicon, metals (e.g., tungsten), metal nitrides, and/or metal silicides. The insulating patterns 115 may be formed of or may include a silicon oxide layer. The lower insulating layer 105 may be provided to have a smaller thickness than the insulating patterns 115.

The gate electrodes may be sequentially stacked on the substrate 100 (for example, in a vertical or third direction D3). The gate electrodes may include the string selection line SSL, the word lines, and the ground selection line GSL.

The string selection line SSL may be disposed between word lines and the bit lines BL. The ground selection line GSL may be disposed between word lines and the common source line CSL. The word lines may be sequentially stacked on the substrate 100. In the some embodiments, all of the string and ground selection lines SSL and GSL may be provided on the word lines WL. The string selection line SSL may be provided spaced apart from the ground selection line GSL in the second direction D2 by the isolation trench 141. The word lines may include the upper word lines WL1 provided between the substrate 100 and the string selection line SSL, and the lower word lines WL2 provided between the substrate 100 and the ground selection line GSL. The upper word lines WL1 may be spaced apart from the lower word lines WL2 in the second direction D2 by the isolation trench 141.

The device isolation pattern 145 may be provided between the string and ground selection lines SSL and GSL and between the upper word lines WL1 and the lower word lines WL2. The device isolation pattern 145 may be shaped like a line extending parallel to the first direction D1. The device isolation pattern 145 may be formed to fill the isolation trench 141 and may include at least one of, for example, a silicon oxide layer, a silicon nitride layer, and/or a silicon oxynitride layer.

The plurality of the active pillars 130 may be provided to penetrate the stack GS. The active pillars 130 may be arranged along the first direction D1, when viewed in a plan view.

Each of the active pillars 130 may include vertical portions VP penetrating the stack GS and a horizontal portion HP provided below the stack GS to connect the vertical portions VP to each other. The vertical portions VP may be provided in the vertical holes 116 penetrating the stack GS. The horizontal portion HP may be provided in a horizontal recessed region R1 formed in a top portion of the substrate 100. One of the vertical portions VP may be connected to the common source line CSL, and another of the vertical portions VP may be connected to a corresponding one of the bit lines BL. The horizontal portion HP may be provided between the substrate 100 and the stack GS to connect the vertical portions VP to each other.

In detail, in each of the active pillars 130, the vertical portions VP may include a first vertical portion VP1 penetrating the upper word lines WL1 and the string selection line SSL and a second vertical portion VP2 penetrating the lower word lines WL2 and the ground selection line GSL. The first vertical portion VP1 may be connected to a corresponding one of the bit lines BL and the second vertical portion VP2 may be connected to the common source line CSL. The horizontal portion HP may extend from a region below the upper word lines WL1 toward a region below the lower word lines WL2, thereby connecting the first vertical portion VP1 to the second vertical portion VP2.

Each of the active pillars 130 may include a semiconductor pattern penetrating the stack GS. In each of the active pillars 130, the vertical portion VP of the semiconductor pattern may be provided to cover an inner side surface of the vertical hole 116 and the horizontal portion HP of the semiconductor pattern may be provided to cover an inner surface of the horizontal recessed region R1. The semiconductor pattern may be formed of or include a semiconductor material. For example, the semiconductor pattern may include the first and second semiconductor patterns 132 and 134 described in the previous embodiments.

Each of the active pillars 130 may have a hollow cylindrical shape or a macaroni shape and may be provided to have the internal hole 135 therein. The internal hole 135 of the active pillars 130 may be filled with the insulating gap-filling pattern 137. The insulating gap-filling pattern 137 may be formed of or include a silicon oxide layer.

The memory pattern 124 may be provided between the active pillars 130 and gate electrodes. The capping sacrificial patterns 122 may be provided between the active pillars 130 and the insulating patterns 115. A gate insulating layer 129 may be interposed between the active pillars 130 and the substrate 100. The gate insulating layer 129 may be formed of a silicon oxide layer. The memory pattern 124 may further include a portion interposed between the gate insulating layer 129 and the active pillar 130 or between the bottom surface of the stack GS and the active pillar 130.

In some embodiments, the memory pattern 124 and the end portions of the gate electrodes may be provided to have structures or shapes similar to those of the previous embodiments. For example, as shown in FIG. 23, the memory pattern 124 may include the blocking insulating layer BCL, the charge storing layer CL, and the tunnel insulating layer TL. The charge storing layer CL and the tunnel insulating layer TL may be extended between the active pillars 130 and the insulating patterns 115. One (e.g., the first blocking insulating layer BCL1) of layers constituting the blocking insulating layer BCL may be extended between the insulating patterns 115 and the active pillars 130, and the other (e.g., the second blocking insulating layer BCL2) of the layers constituting the blocking insulating layer BCL may be extended between the insulating patterns 115 and the gate electrodes. Each of the gate electrodes (e.g., a second word line W2) may include a first portion W2a between the insulating patterns 115 adjacent one another in the vertical direction and a second portion W2b between the capping sacrificial patterns 122 adjacent one another in the vertical direction. The second portion W2b may include the edge portions EP1, each of which is interposed between the memory pattern 124 and the insulating pattern 115 to have a sharp shape. The structure of the memory pattern 124 and/or the gate electrode according to some embodiments may be variously changed, as described with reference to FIGS. 6B through 6D.

Figure 24:
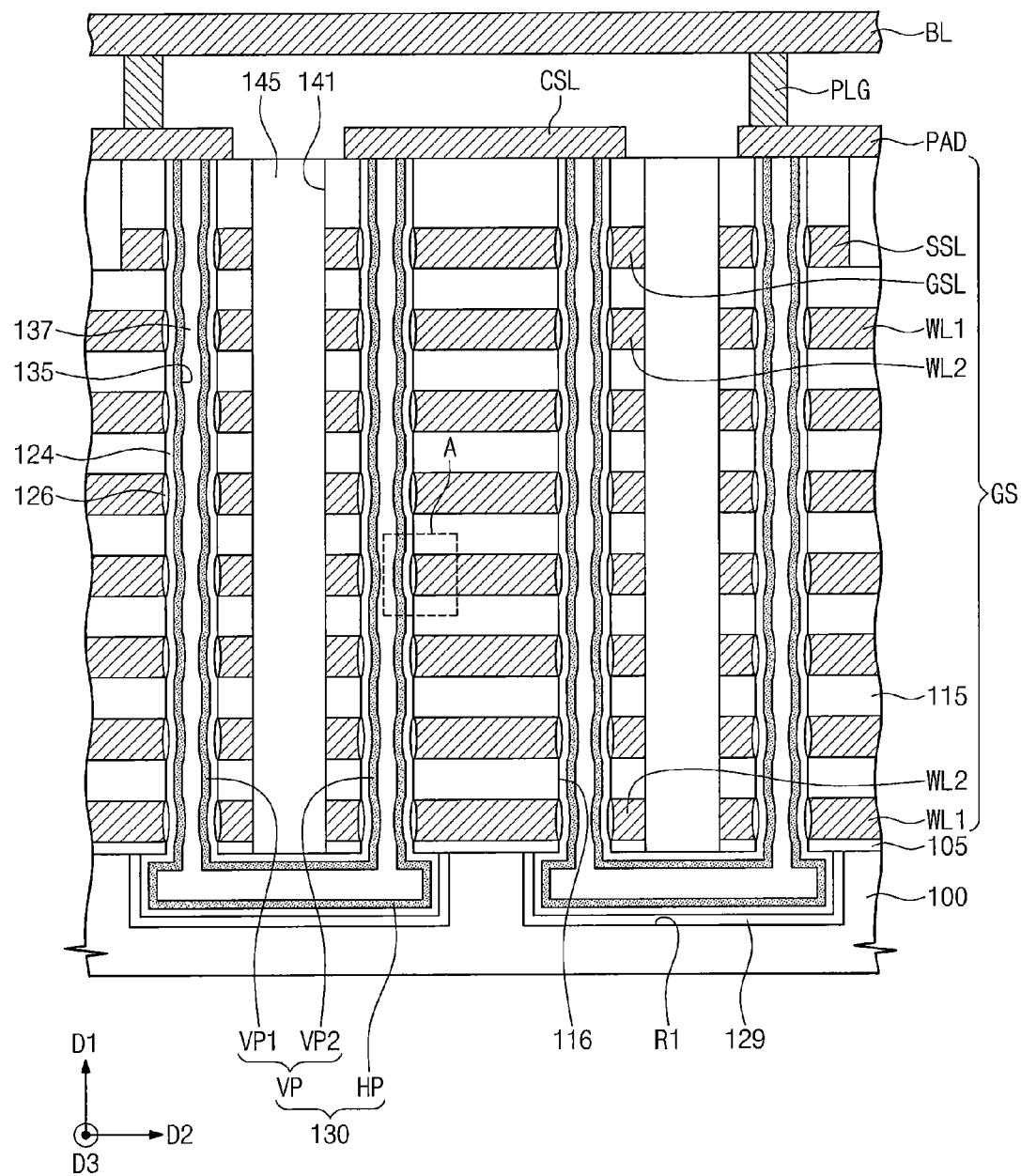
FIG. 24 is a sectional view illustrating a semiconductor device according to yet other example embodiments of the inventive concept.
Figure 25:
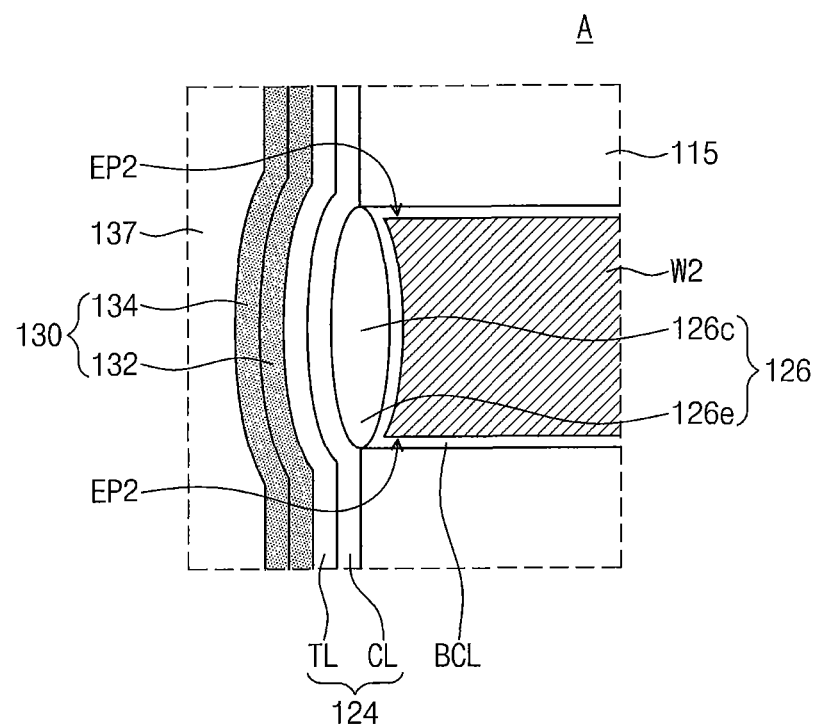
FIG. 25 is an enlarged view of a portion A of FIG. 24.

FIG. 24 is a sectional view illustrating a semiconductor device according to yet other example embodiments of the inventive concept, and FIG. 25 is an enlarged view of a portion A of FIG. 24. In the following description, a previously-described element may be identified by a similar or identical reference number without repeating an overlapping description thereof, for the sake of brevity.

Referring to FIG. 24, a semiconductor device according to some embodiments may be configured to have substantially the same features as that of FIG. 22, except that the buffer oxide patterns 126 are interposed between the memory pattern 124 and the gate electrodes and the capping sacrificial patterns 122 are not provided. In addition, the memory pattern 124 and the end portions of the gate electrodes according to some embodiments may be provided to have structures or shapes similar to those of the previous embodiments. For example, as shown in FIG. 25, the memory pattern 124 may include the charge storing layer CL and the tunnel insulating layer TL. The memory pattern 124 may be provided to have a vertical, but partially-bending, profile with respect to the substrate 100, as in the afore-described embodiments. The sidewall of the gate electrode (e.g., the second word line W2) facing the buffer oxide pattern 1261 may have a laterally concave shape. For example, the sidewall of the second word line W2 adjacent to the active pillar 130 may have a concave shape in a direction away from the active pillars 130. As an example, the corner portions EP2 of the second word lines W2 adjacent the end portions 126e of the buffer oxide patterns 126 may be sharply protruded toward the buffer oxide patterns 126.

Figure 26:
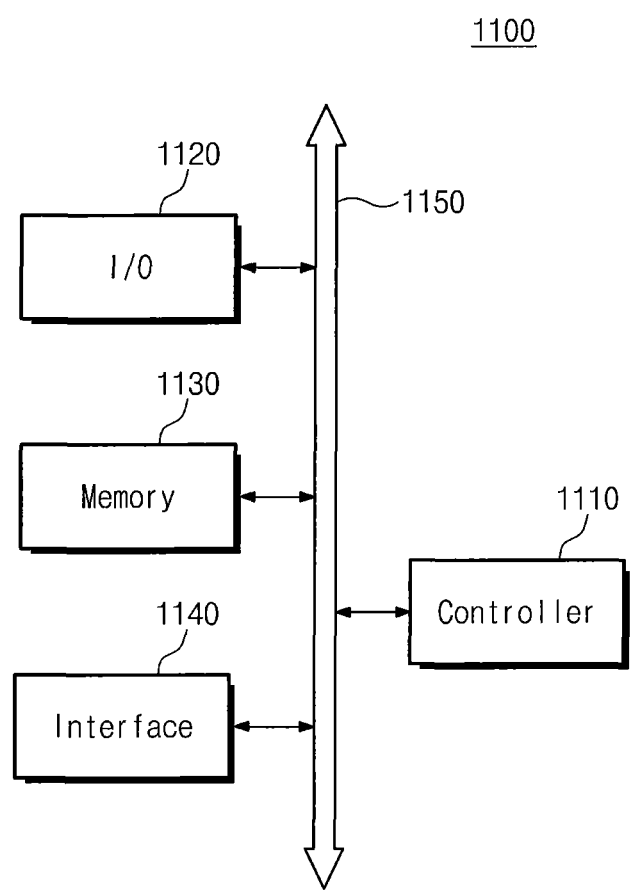
FIG. 26 is a schematic block diagram illustrating an example of an electronic system including a semiconductor device according to example embodiments of the inventive concept.

FIG. 26 is a schematic block diagram illustrating an example of an electronic system including a semiconductor device according to example embodiments of the inventive concept.

Referring to FIG. 26, an electronic system 1100 according to example embodiments of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted. The memory device 1130 may include at least one of the semiconductor memory devices according to example embodiments of the inventive concept.

The controller 1110 may include at least one of a microprocessor, a digital signal processor, a microcontroller, and/or another logic device, which is configured to have a similar function to them. The I/O unit 1120 may include a keypad, a keyboard, and/or a display unit. The memory device 1130 may store data and/or commands. The interface unit 1140 may transmit electrical data to a communication network and/or may receive electrical data from a communication network. The interface unit 1140 may operate in a wireless and/or wired manner. For example, the interface unit 1140 may include an antenna for the wireless communication or a transceiver for the wired and/or wireless communication. Although not shown in the drawings, the electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card and/or an electronic product. The electronic product may receive or transmit information data in a wireless manner.

Figure 27:
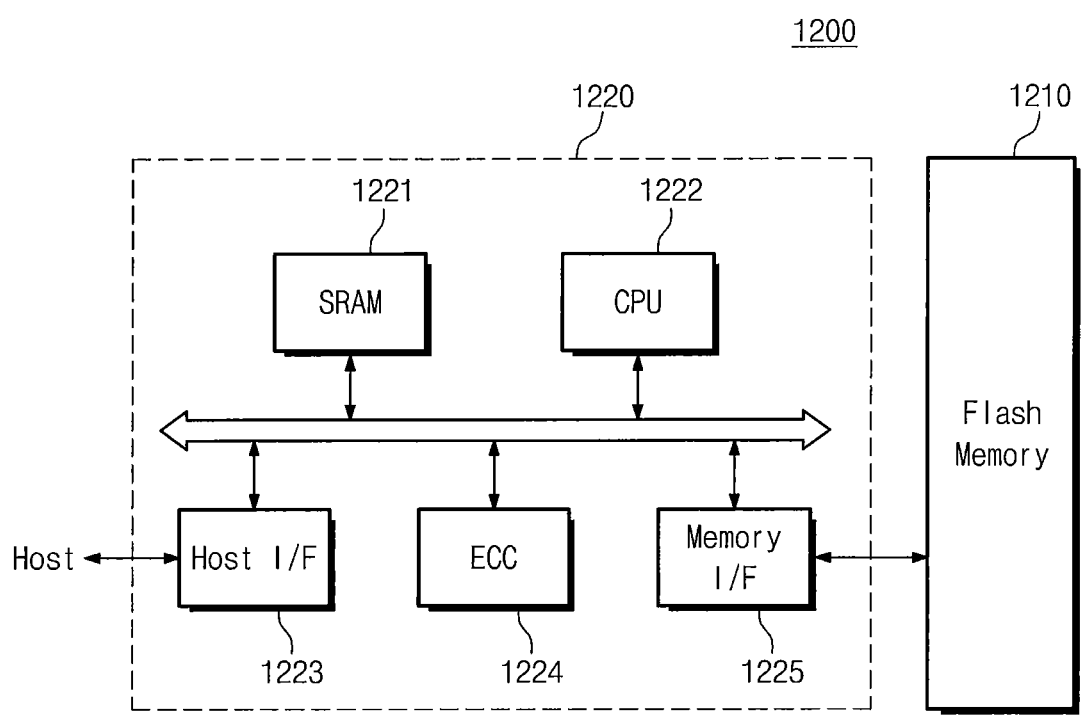
FIG. 27 is a schematic block diagram illustrating an example of a memory card including a semiconductor device according to example embodiments of the inventive concept.

FIG. 27 is a schematic block diagram illustrating an example of a memory card including a semiconductor device according to example embodiments of the inventive concept.

Referring to FIG. 27, a memory card 1200 may include a memory device 1210. The memory device 1210 may include at least one of the semiconductor memory devices according to the afore-described embodiments of the inventive concept. In other embodiments, the memory device 1210 may further include a semiconductor memory device, which is of a different type from the semiconductor memory devices according to the afore-described embodiments of the inventive concept. For example, the memory device 1210 may further include a dynamic random access memory (DRAM) device and/or a static random access memory (SRAM) device. The memory card 1200 may include a memory controller 1220 that controls data communication between a host and the memory device 1210.

The memory controller 1220 may include a processing unit 1222 that controls overall operations of the memory card 1200. In addition, the memory controller 1220 may include an SRAM device 1221 used as an operation memory of the processing unit 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. The memory card 1200 may further include a read only memory (ROM) device that stores code data to interface with the host. The memory card 1200 may be used as a portable data storage card. In some embodiments, the memory card 1200 may be provided in the form of a solid state drives (SSD), instead of hard disks of computer systems\.

Figure 28:
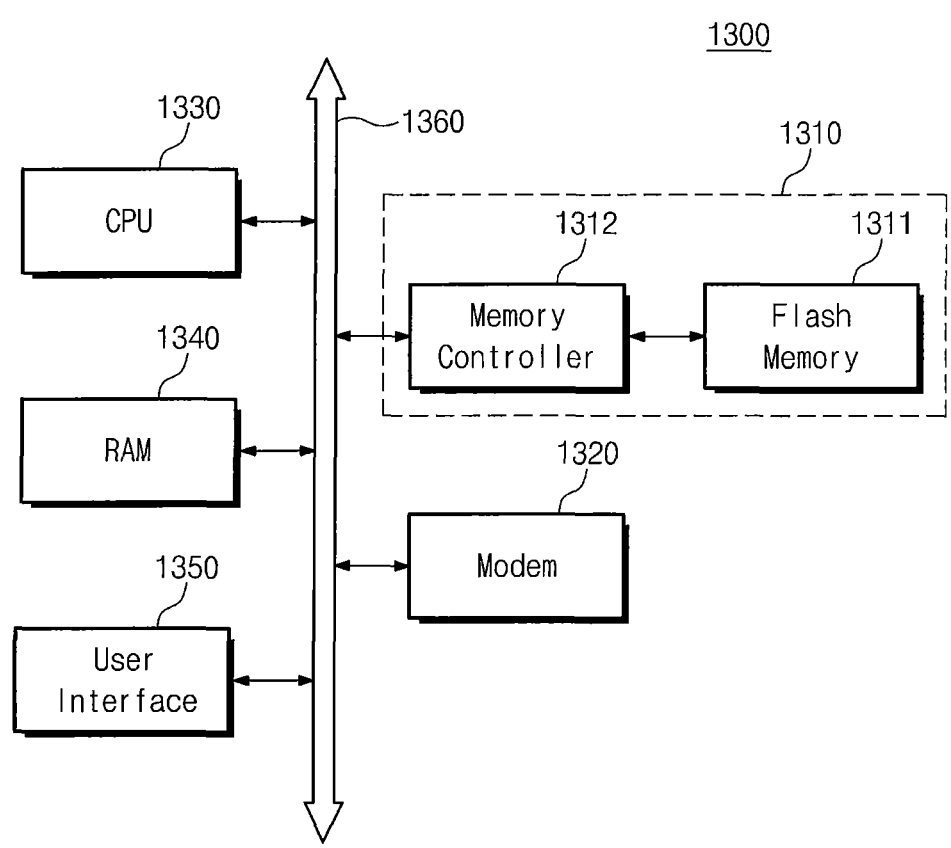
FIG. 28 is a schematic block diagram illustrating an example of an information processing system including a semiconductor device according to example embodiments of the inventive concept.

FIG. 28 is a schematic block diagram illustrating an example of an information processing system including a semiconductor device according to example embodiments of the inventive concept.

Referring to FIG. 28, an information processing system 1300 may be provided as a mobile device, a desk top computer, or a part thereof. The memory system 1310 may include a memory device 1311 and a memory controller 1312 controlling an overall operation of the memory device 1311. The information processing system 1300 may include a memory system 1310 including at least one of the semiconductor memory devices according to example embodiments of the inventive concept. The information processing system 1300 also includes a modem 1320, a central processing unit (CPU) 1330, a RAM 1340, and a user interface 1350, which may be electrically connected to the memory system 1310 via a system bus 1360. Data processed by the CPU 1330 and/or input from the outside may be stored in the memory system 1310. Here, the memory system 1310 may be provided as a solid state drive SSD, and thus, the information processing system 1300 may be able to store reliably a large amount of data in the memory system 1310. This increase in reliability of the memory system 1310 enables the information processing system 1300 to conserve resources for error correction and realize a high speed data exchange function. Although not illustrated, it is apparent to those skilled in the art that, for example, an application chipset, a camera image sensor, a camera image signal processor (ISP), and/or an input/output device, among others, may further be included in the information processing system 1300 according to example embodiments of the inventive concept.

According to example embodiments of the inventive concept, a gate electrode may be provided in such a way that an end portion thereof has a sharp or tapering portion adjacent a charge storing layer. Accordingly, during an erase operation, it is possible to concentrate an electric field on a portion (e.g., the sharp portion) of the gate electrode and thereby to easily cause a back tunneling of electrons. In other words, it is possible to easily inject electrons into the charge storing layer from the gate electrode, during an erase operation. The injected electrons may prevent or suppress holes trapped in the charge storing layer from being vertically spread, during the erase operation. This makes it possible to suppress electric charges (i.e., holes) stored in the charge storing layer from being lost and thereby to improve a charge retention property of a semiconductor device. As a result, the semiconductor device can have an improved reliability property.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate;
   gate electrodes vertically stacked on the substrate;
   insulating patterns between the gate electrodes;
   an active pillar that penetrates the gate electrodes and the insulating patterns and that is electrically coupled with the substrate; and
   a memory pattern between the gate electrodes and the active pillar and between the insulating patterns and the active pillar,
   wherein the gate electrodes comprise respective edge portions that extend between the memory pattern and the insulating patterns.

2. The device of claim 1, further comprising capping sacrificial patterns isolated between the insulating patterns and the memory pattern,
   wherein the edge portions overlap the capping sacrificial patterns, when viewed in a plan view.

3. The device of claim 2, wherein each of the gate electrodes comprises:
   a first portion positioned between a vertically adjacent pair of the insulating patterns; and
   a second portion extended from the first portion and positioned between a vertically adjacent pair of the capping sacrificial patterns,
   wherein the edge portions comprise the respective second portions.

4. The device of claim 3, wherein the second portion comprises a sidewall that faces the memory pattern and that convexly protrudes toward the memory pattern.

5. The device of claim 2, wherein, when viewed in a sectional view, each of the edge portions comprises a portion having a width that decreases in a direction toward the capping sacrificial patterns.

6. The device of claim 2, wherein at least a portion of one of the edge portions overlaps one of the capping sacrificial patterns, in a horizontal direction.

7. The device of claim 2, wherein each of the capping sacrificial patterns contacts one of the insulating patterns, and
   wherein the capping sacrificial patterns comprise a material different from the insulating patterns.

8. The device of claim 2, wherein the memory pattern comprises:
   a blocking insulating layer that is adjacent the gate electrodes;
   a tunnel insulating layer that is adjacent the active pillar; and
   a charge storing layer between the blocking insulating layer and the tunnel insulating layer.

9. The device of claim 2, further comprising a lower semiconductor pattern that is between the substrate and the active pillar to be in contact with the substrate.

10. The device of claim 9, further comprising a lower gate electrode that is positioned at a lower level than a lowermost one of the gate electrodes relative to the substrate,
    wherein the lower semiconductor pattern has a top surface that is higher than a top surface of the lower gate electrode relative to the substrate.

11. The device of claim 9, wherein a lowermost one of the capping sacrificial patterns is in contact with a top surface of the lower semiconductor pattern.

12. The device of claim 1, wherein the edge portions are provided to have a portion having a width that decreases in a direction toward or away from the substrate.

13. The device of claim 1, wherein the active pillar is a first active pillar,
    wherein the device further comprises a second active pillar that is paired with the first active pillar, and
    wherein the substrate has a horizontal recess under the gate electrodes, and the first and second active pillars are connected to each other in the horizontal recess.

14. A semiconductor device, comprising:
    a substrate;
    gate electrodes vertically stacked on the substrate;
    insulating patterns between the gate electrodes;
    an active pillar that penetrates the gate electrodes and the insulating patterns and that is electrically coupled with the substrate;
    a memory pattern between the gate electrodes and the active pillar and between the insulating patterns and the active pillar; and
    buffer oxide patterns isolated between the gate electrodes and the memory pattern,
    wherein an end portion of one of the gate electrodes adjacent one of the buffer oxide patterns comprises a portion protruding toward the one of buffer oxide patterns.

15. The device of claim 14, wherein a first portion of the one of buffer oxide patterns is between a vertically adjacent pair of the insulating patterns and a second portion of the one of the buffer oxide patterns protrudes from the first portion of the one of the buffer oxide patterns toward the memory pattern.

16. The device of claim 15, wherein, when viewed in a sectional view, the first portion of the one of the buffer oxide patterns has a sidewall convexly protruding toward an adjacent one of the gate electrodes, and the second portion of the one of the buffer oxide patterns has a sidewall convexly protruding toward the memory pattern.

17. A semiconductor device, comprising:
    gate electrodes that are vertically stacked on a substrate;
    insulating patterns between the gate electrodes;
    an active pillar that penetrates the gate electrodes and the insulating patterns;
    a memory pattern that is between the gate electrodes and the active pillar and that is between the insulating patterns and the active pillar; and
    capping sacrificial patterns isolated between the insulating patterns and the memory pattern,
    wherein each of the gate electrodes comprises:
    a first portion positioned between a vertically adjacent pair of the insulating patterns; and
    a second portion extended from the first portion and positioned between a vertically adjacent pair of the capping sacrificial patterns, wherein the second portion includes an edge portion of the respective gate electrodes that extends between the memory pattern and the insulating patterns.

18. The device of claim 17, wherein the second portion comprises a sidewall that faces the memory pattern and that convexly protrudes toward the memory pattern.

19. The device of claim 1, wherein the gate electrodes are stacked in a vertical direction,
    wherein each of the gate electrodes comprises a body portion, and the edge portion of each of the gate electrodes protrudes from the body portion thereof toward the active pillar, wherein the gate electrodes comprises a first gate electrode, and wherein the body portion of the first gate electrode has a first width in the vertical direction adjacent the edge portion of the first gate electrode, the edge portion of the first gate electrode has a second width in the vertical direction adjacent the memory pattern, and the first width is less than the second width.

20. The device of claim 19, wherein the edge portion of the first gate electrode has the first width in the vertical direction adjacent the body portion of the first gate electrode, and wherein the edge portion has a width in the vertical direction that monotonically increases from the first width to the second width along a direction from the body portion of the first gate electrode and toward the memory pattern.

* * * * *